(12) United States Patent
Chen et al.

(10) Patent No.: US 12,324,247 B2
(45) Date of Patent: *Jun. 3, 2025

(54) INTEGRATED STANDARD CELL STRUCTURE

(71) Applicant: Taiwan Semiconductor Manufacturing Co., Ltd., Hsin-Chu (TW)

(72) Inventors: Fang Chen, Hsinchu (TW); Jhon Jhy Liaw, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/522,727

(22) Filed: Nov. 29, 2023

(65) Prior Publication Data

US 2024/0113097 A1   Apr. 4, 2024

Related U.S. Application Data

(63) Continuation of application No. 17/850,067, filed on Jun. 27, 2022, now Pat. No. 11,855,072, which is a
(Continued)

(51) Int. Cl.
*H10D 89/10* (2025.01)
*H10D 62/10* (2025.01)
(Continued)

(52) U.S. Cl.
CPC ........... *H10D 89/10* (2025.01); *H10D 62/115* (2025.01); *H10D 84/0188* (2025.01);
(Continued)

(58) Field of Classification Search
CPC .............. H01L 27/0207; H01L 27/092; H01L 27/11807; H01L 21/823878;
(Continued)

(56) References Cited

U.S. PATENT DOCUMENTS 6,691,294 B2   2/2004  Law
8,796,666 B1   8/2014  Huang et al.
(Continued)

FOREIGN PATENT DOCUMENTS

CN   1710711 A   12/2005
CN   105470302 A   4/2016
(Continued)

*Primary Examiner* — Tu-Tu V Ho
(74) *Attorney, Agent, or Firm* — HAYNES AND BOONE, LLP

(57) ABSTRACT

An integrated circuit includes a first standard cell having a first pFET and a first nFET integrated, and having a first dielectric gate on a first standard cell boundary. The integrated circuit further includes a second standard cell being adjacent to the first standard cell, having a second pFET and a second nFET integrated, and having a second dielectric gate on a second standard cell boundary. The integrated circuit also includes a first filler cell configured between the first and second standard cells, and spanning from the first dielectric gate to the second dielectric gate. The first pFET and the second pFET are formed on a first continuous active region. The first nFET and the second nFET are formed on a second continuous active region.

20 Claims, 17 Drawing Sheets

Related U.S. Application Data continuation of application No. 17/012,415, filed on Sep. 4, 2020, now Pat. No. 11,373,993, which is a continuation of application No. 16/397,021, filed on Apr. 29, 2019, now Pat. No. 10,770,449, which is a continuation of application No. 16/008,563, filed on Jun. 14, 2018, now Pat. No. 10,276,554.

(51) Int. Cl.
  *H10D 84/01* (2025.01)
  *H10D 84/03* (2025.01)
  *H10D 84/85* (2025.01)
  *H10D 84/90* (2025.01)

(52) U.S. Cl.
  CPC ........... *H10D 84/038* (2025.01); *H10D 84/85* (2025.01); *H10D 84/907* (2025.01); *H10D 84/0172* (2025.01)

(58) Field of Classification Search
  CPC ........ H01L 21/823828; H01L 29/0649; H10D 89/10; H10D 84/0188; H10D 84/907; H10D 84/85; H10D 84/038; H10D 84/0172; H10D 62/115
  USPC ........................................................ 257/401
  See application file for complete search history.

(56) References Cited

U.S. PATENT DOCUMENTS

| | | |
|---|---|---|
| 8,837,810 B2 | 9/2014 | Chen et al. |
| 9,093,530 B2 | 7/2015 | Huang et al. |
| 9,134,633 B2 | 9/2015 | Lin et al. |
| 9,159,724 B2 | 10/2015 | Wang et al. |
| 9,230,867 B2 | 1/2016 | Cheng et al. |
| 9,304,403 B2 | 4/2016 | Lin et al. |
| 9,404,743 B2 | 8/2016 | Chiu et al. |
| 9,547,741 B2 | 1/2017 | Schroeder et al. |
| 9,548,303 B2 | 1/2017 | Lee et al. |
| 9,823,585 B2 | 11/2017 | Shih et al. |
| 9,841,687 B2 | 12/2017 | Lee et al. |
| 10,361,195 B2 | 7/2019 | Sengupta et al. |
| 11,855,072 B2 * | 12/2023 | Chen .................. H01L 29/0649 |
| 2011/0133822 A1 | 6/2011 | Mazure et al. |
| 2013/0126987 A1 | 5/2013 | Uto et al. |
| 2013/0263077 A1 | 10/2013 | Baek et al. |
| 2015/0118812 A1 | 4/2015 | Yang et al. |
| 2016/0110489 A1 | 4/2016 | Schroeder et al. |
| 2017/0287933 A1 | 10/2017 | Chen et al. |

FOREIGN PATENT DOCUMENTS

| | | |
|---|---|---|
| CN | 107978598 A | 5/2018 |
| JP | 2008263185 | 10/2008 |
| TW | 201434111 A | 9/2014 |
| TW | 201816943 A | 5/2018 |

\* cited by examiner ated circuit (IC) structure 100 and FIG. 1B is a sectional view of

INTEGRATED STANDARD CELL STRUCTURE

PRIORITY

This application is a continuation of U.S. patent application Ser. No. 17/850,067, filed Jun. 27, 2022, which is a continuation of U.S. patent application Ser. No. 17/012,415, filed Sep. 4, 2020, which is a continuation of U.S. patent application Ser. No. 16/397,021, filed Apr. 29, 2019, which is a continuation of U.S. patent application Ser. No. 16/008,563, filed Jun. 14, 2018, the entire disclosures of which are herein incorporated by reference.

BACKGROUND

In the design of integrated circuits (IC), standard cells with certain functions are repeated used with high frequency. Accordingly, those standard cells are predesigned and packed in a cell library. The cell library is provided to the IC designers for their particular designing. During integrated circuit designing, the standard cells are retrieved from the cell libraries and placed into desired locations, thus reducing the design effort. Routing is then performed to connect the standard cells and other circuit blocks to form the desired integrated circuit. Pre-defined design rules are followed when placing the standard cells into the desired locations. For example, a standard cell is placed close to another standard cell, the space between those two standard cells is determined according to the pre-defined rules. The reserved space between the standard cells and the cell boundaries results in a significant increase in the areas of the standard cells. In addition, because the active regions are spaced apart from the cell boundaries, when the standard cells are placed abutting each other, the active regions will not be joined, even if some of the active regions in the neighboring cells need to be electrically coupled. The spaced apart active regions have to be electrically connected using metal lines. The performance of the resulting device is degraded. Layout patterns and configurations can affect the yield and the design performance of the standard cells. It is therefore desired to have an integrated circuit layout structure, and the method making the same to address the above issues.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1A:
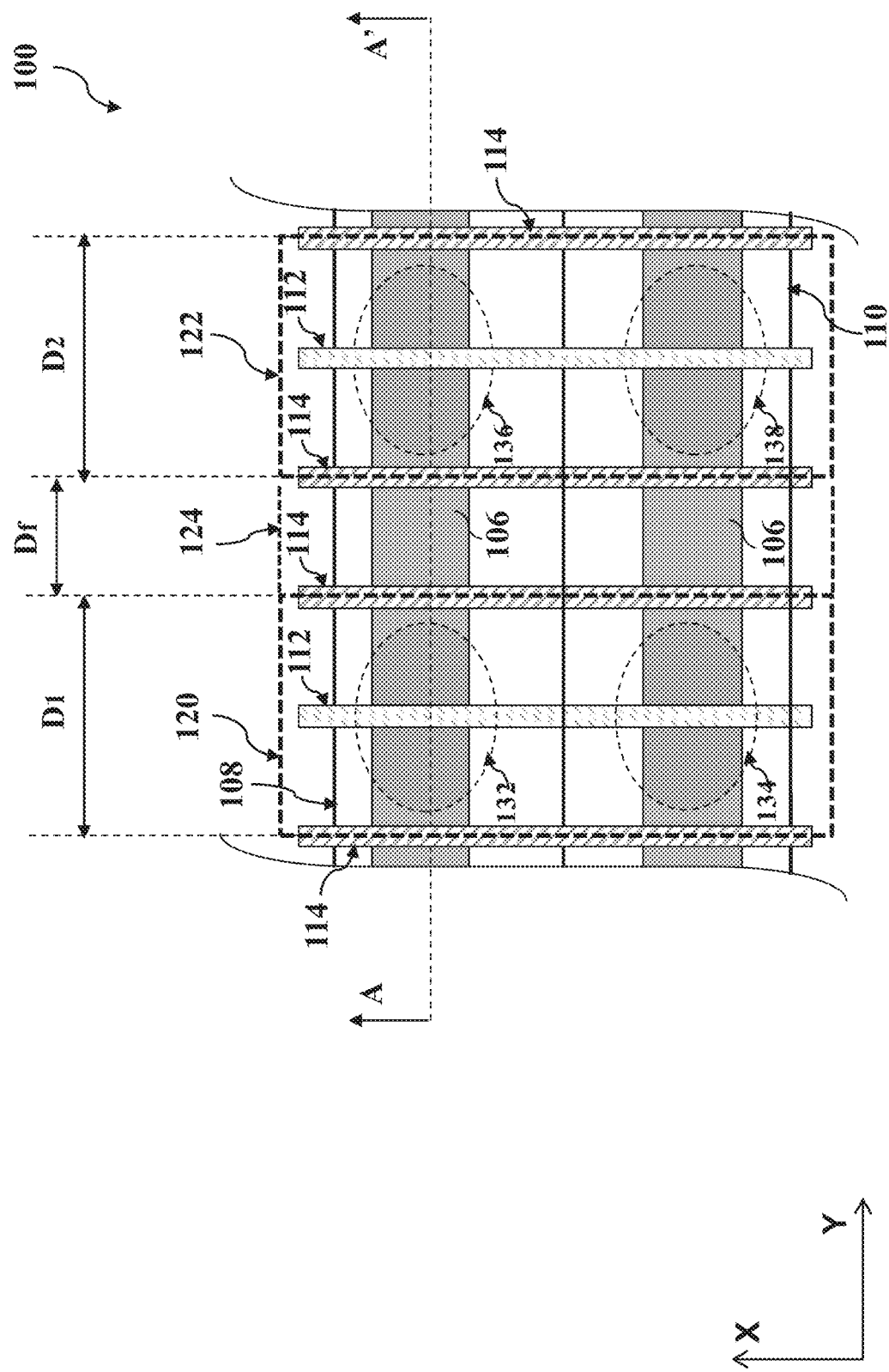
FIG. 1A is a top view of an integrated circuit (IC) structure constructed according to various aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

The present disclosure provides various embodiments of integrated circuit (IC) formed on a semiconductor substrate. The integrated circuit has a design layout incorporated with various standard cells. The standard cells are predesigned IC structure to be repeatedly used in individual IC designs. Effective IC design layouts include various predesigned standard cells and predefined rules of placing those standard cells for enhanced circuit performing and reduced circuit areas.

Figure 1B:
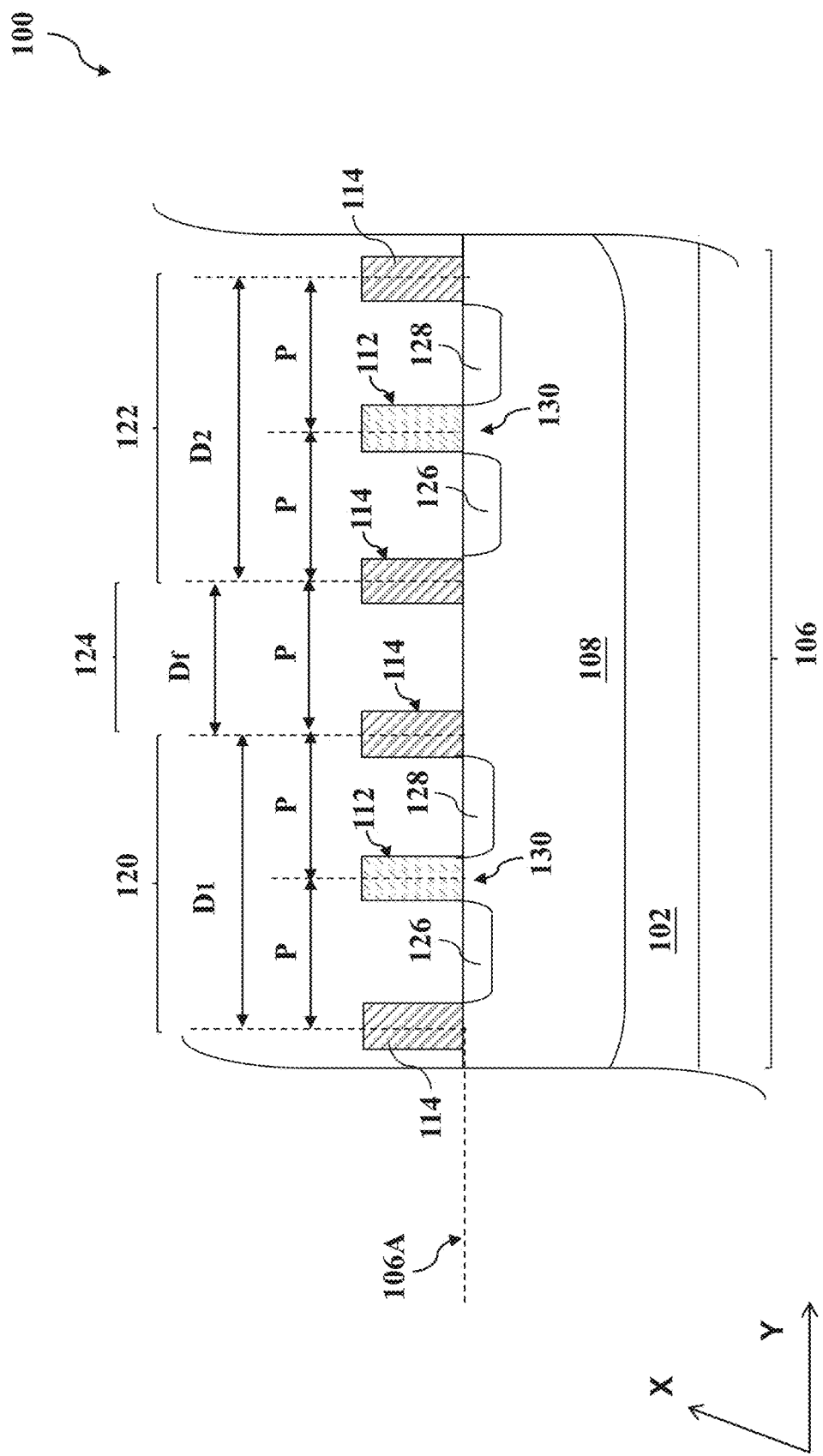
FIG. 1B is a sectional view of the IC structure of FIG. 1A, constructed according to various aspects of the present disclosure in one embodiment.

FIG. 1A is a top view a sectional view and of an integrated circuit (IC) structure 100 and FIG. 1B is a sectional view of the IC structure 100 along the dashed line AA', constructed according to various aspects of the present disclosure in one embodiment. In some embodiments, the IC structure 100 is formed on fin active regions and includes fin field-effect transistors (FinFETs). In some embodiments, the IC structure 100 is formed on flat active regions and includes field-effect transistors (FETs). With the IC structure 100 as an example for illustration, an IC structure and a method to incorporate standard cells are collectively described.

In various embodiments, the IC structure 100 includes one or more standard cell placed to the IC layout by predefined rules. Those standard cells are repeatedly used in integrated circuit designs and therefore predesigned according to manufacturing technologies and saved in a standard cell library. IC designers could retrieve those standard cells, incorporate in their IC designs, and place into the IC layout according to the predefined placing rules. The standard cells may include various basic circuit devices, such as inverter, AND, NAND, OR, XOR, and NOR, which are popular in digital circuit design for applications, such as central processing unit (CPU), graphic processing unit (GPU), and system on chip (SOC) chip designs. The Standard cells may include other frequently used circuit blocks, such flip-flop circuit and latch.

The IC structure 100 includes a semiconductor substrate 102. The semiconductor substrate 102 includes silicon. Alternatively, the substrate 102 may include an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Possible substrates 102 also include a silicon-on-insulator (SOI) substrate. SOI substrates are fabricated using separation by implantation of oxygen (SIMOX), wafer bonding, and/or other suitable methods.

The substrate 102 also includes various isolation features, such as isolation features formed on the substrate 102 and defining various active regions 106 on the substrate 102. The isolation feature utilizes isolation technology, such as shallow trench isolation (STI), to define and electrically isolate the various active regions. Each active region 106 is surrounded by a continuous isolation feature such that it is separated from other adjacent active regions. The isolation feature includes silicon oxide, silicon nitride, silicon oxynitride, other suitable dielectric materials, or combinations thereof. The isolation feature is formed by any suitable process. As one example, forming STI features includes a lithography process to expose a portion of the substrate, etching a trench in the exposed portion of the substrate (for example, by using a dry etching and/or wet etching), filling the trench (for example, by using a chemical vapor deposition process) with one or more dielectric materials, and planarizing the substrate and removing excessive portions of the dielectric material(s) by a polishing process, such as a chemical mechanical polishing (CMP) process. In some examples, the filled trench may have a multi-layer structure, such as a thermal oxide liner layer and filling layer(s) of silicon nitride or silicon oxide.

The active region 106 is a region with semiconductor surface wherein various doped features are formed and configured to one or more device, such as a diode, a transistor, and/or other suitable devices. The active region may include a semiconductor material similar to that (such as silicon) of the bulk semiconductor material of the substrate 102 or different semiconductor material, such as silicon germanium (SiGe), silicon carbide (SiC), or multiple semiconductor material layers (such as alternative silicon and silicon germanium layers) formed on the substrate 102 by epitaxial growth, for performance enhancement, such as strain effect to increase carrier mobility.

In some embodiments, the active region 106 is three-dimensional, such as a fin active region extended above the isolation feature. The fin active region 106 is extruded from the substrate 102 and has a three-dimensional profile for more effective coupling between the channel and the gate electrode of a FET. Particularly, the substrate 102 has a top surface and the fin active region 106 has a top surface 106A that is above the top surface of the substrate 102. The fin active region 106 may be formed by selective etching to recess the isolation features, or selective epitaxial growth to grow active regions with a semiconductor same or different from that of the substrate 102, or a combination thereof.

The semiconductor substrate 102 further includes various doped features, such as n-type doped wells, p-type doped wells, source and drain features, other doped features, or a combination thereof configured to form various devices or components of the devices, such as source and drain features of a field-effect transistor. In the present example illustrated in FIG. 1A, the IC structure 100 includes a negatively doped well (also referred to as N well) 108 and a positively doped well (also referred to as P well) 110. The N well 108 includes negative dopant, such as phosphorus. And the P well 110 includes positive dopant, such as boron. The N well 108 and the P well 110 are formed by suitable technologies, such as ion implantation, diffusion or a combination thereof. In the present embodiment, one active region 106 is formed in the N well 108 and another active region 106 is formed in the P well 110.

Various IC devices formed on the semiconductor substrate 102. The IC devices includes fin field-effect transistors (FinFETs), diodes, bipolar transistors, imaging sensors, resistors, capacitors, inductors, memory cells, or a combination thereof. In FIG. 1A, exemplary FETs are provided only for illustration.

The IC structure 100 further includes various gates (or gate stacks) 112 having elongated shape oriented in a first direction (X direction). In the present embodiment, X and Y directions are orthogonal and define a top surface of the semiconductor substrate 102. A gate stack 112 includes a gate dielectric layer and a gate electrode. The gate stack 112 is a feature of a FET and functions with other features, such as source/drain (S/D) features and a channel, wherein the channel is in a portion of the active region directly underlying the gate; and the S/D features are in the active region and are disposed on two sides of the gate. It is noted that the gate 112 should not be confused with a logic gate, such a NOR logic gate.

The IC structure 100 also includes dielectric gates 114 disposed on the semiconductor substrate 102. A dielectric gate 114 is not a gate and does not function as a gate. Instead, the dielectric gate 114 is a dielectric feature that includes one or more dielectric material and function as an isolation feature, in some instances.

Each of the dielectric gates 114 also have an elongated shape oriented in the X direction. The dielectric gates 114 are similar to the gates 112 in term of formation. In some embodiments, the gates 112 and the dielectric gates 114 are collectively formed by a procedure, such as a gate-last process. In furtherance of the embodiments, dummy gates are first formed by deposition and patterning, in which the patterning further includes lithography process and etching. Afterward, a subset of the dummy gates is replaced to form gates 112 by depositing a gate dielectric layer and a gate electrode while the rest of the dummy gates are replaced to form dielectric gates 114 by depositing only dielectric material(s). Furthermore, the dielectric gate 114 is disposed and configured differently and therefore functions differently. In the present embodiment, some dielectric gates 114 are placed on the borders of the standard cells to function as isolation to separate one standard cell to an adjacent standard cell, and some dielectric gates 114 are placed inside the standard cells for one or more considerations, such as isolation between the adjacent FETs and adjust pattern density. Thus, the dielectric gates 114 provides isolation function between adjacent IC devices and additionally provides pattern density adjustment for improved fabrication, such as etching, deposition and chemical mechanical polishing (CMP).

The IC structure 100 includes various standard cells placed and configured on the semiconductor substrate 102 according to the predefined rules. A standard cell is a group of transistor and interconnect structures that provides a boolean logic function (such as AND, OR, XOR, XNOR, or inverters) or a storage function (such as flipflop or latch). Those standard cells are pre-designed and collected in an IC standard cell library for repeatedly use during IC design for compatible, consistent, and efficient IC design and IC fabrication. A filler cell is an IC designed block inserted between two adjacent standard cells to be compatible with IC design and IC fabrication rules. Proper design and configuration of the standard cells and filler cells can enhance the packing density and circuit performance. In the present embodiment, each standard cell includes two dielectric gates configured at the two boundary lines oriented along the X direction. Each filler cell includes two dielectric gates at the two boundary lines oriented along the X direction. Furthermore, a standard cell and an adjacent filler cell share a dielectric gate at the common boundary. In the present embodiment, the IC structure 100 includes a first standard cell 120 and a second standard cell 122 interposed by a filler cell 124. Boundary lines of the standard cells and the filler cell are illustrated by the dashed lines in FIG. 1A.

When the second standard cell 122 is placed next to the first standard cell 120, it is configured with a filler cell 124 interposed between, and the filler cell 124 spans a dimension $D_f$ of one pitch dimension P. The dimension P will be further explained below.

Each standard cell (such as 120 and 122) is bordered by a dielectric gate 114 as illustrated in FIG. 1A. For example, the first standard cell 120 spans a first dimension $D_1$ along the Y direction and the second standard cell 122 spans a second dimension $D_2$ along the Y direction. In the present design, $D_1 > D_f$ and $D_2 > D_f$.

Each standard cell includes at least one gate 112 configured to form one or more field effect transistor. In the present embodiment, the first standard cell 120 and the second standard cell 122 each includes one gate 112. The gates 112 and the dielectric gates 114 are equally distanced. In other words, all gates (including dielectric gates 114 and gates 112) are configured into a periodic structure a pitch P. Here the pitch is the dimension measured from the same location of the adjacent features, such as center to center. Thus, the filler cell 124 spans one pitch dimension $D_f = P$, along the Y direction. The first standard cell 120 spans a two-pitch dimension or $D_1 = 2*P$ along the Y direction. Similarly, the second standard cell 122 spans a two-pitch dimension or $D_2 = 2*P$, along the Y direction.

Especially, each active region 106 has a continuous structure extending through the adjacent standard cells (such as 120 and 122) and the filler cell (such as 124) interposed between. According to the present disclosure, when the second standard cell is placed next to the first standard cell, the second standard cell is separated from the first standard cell by a filler cell 124 having a one pitch dimension P; and all gates 112 and dielectric gates 114 are placed over the same continuous active region (s) 106.

In the present embodiment, the IC structure 100 includes the first active region 106 in the N well 108 and the second active region 106 in the P well 110. The gate 112 in the first standard cell 120 extends continuously from the first active region 106 (in the N well 108) to the second active region 106 (in the P well 110) along the X direction. Similarly, the gate 112 in the second standard cell 122 extends continuously from the first active region 106 (in the N well 108) to the second active region 106 (in the P well 110) along the X direction. The dielectric gates 114 on the boundary lines of the standard cells also extends continuously from the first active region 106 (in the N well 108) to the second active region 106 (in the P well 110) along the X direction. Each gate 112 is next to a dielectric gate 114. Since the active regions are continuous, the isolation between transistors is achieved by the dielectric gates 114.

With a source 126, drain 128, and channel 130 formed for each transistor associated with a respective active region and a respective standard cell, the first standard cell 120 includes one p-type FET (pFET) 132 in the N well 108 and one n-type FET (nFET) 134 in the P well 110; and the second standard cell 122 includes one pFET 136 in the N well 108 and one nFET 138 in the P well 110. In the present embodiment, the pFET 132 and the nFET 134 in the first standard cell 120 are integrated to form a functional circuit block, such as a complimentary FET; and the pFET 136 and the nFET 138 in the second standard cell 122 are integrated to form a functional circuit block, such as another complimentary FET.

Thus, the adjacent standard cells have a spacing of one pitch dimension P, which ensure logic circuit packing density. The active regions are continuous through multiple cells, and a transistor is isolated by the dielectric gate 114. The continuity of the active regions maintains a regular layout for fabrication friendliness. In some embodiments, since a transistor is always next to a dielectric gate, the design uncertainty is reduced. There is not abutment constrain during cell placement with continuous active region and isolation by dielectric gate. Furthermore, the uniform local density of the dielectric gates 114 and the gates 112 lead to better device performance and processing uniformity.

When placing a standard cell next to another standard cell, the above defined rules applied. Generally, multiple standard cells may be thus placed in a cascade mode. In this case, the filler cell interposed between two adjacent standard cells spans between the two standard cells one pitch dimension. The first standard cell adjoins the filler cell from one side on a dielectric gate and the second standard cell adjoins the filler cell from another side on another dielectric gate.

FIGS. 1A and 1B only provide some exemplary standard cells 120 and 122 and filler cells 124 for illustration. However, it is understood that the IC structure 100 may include additional standard cells and filler cells added in a similar configuration. For examples, depending on individual design, additional standard cells and filler cells may be added to the left edge, to the right edge, to the up edge, and/or to the down edge of FIG. 1A in a similar configuration. The IC structures in other figures, such as those in FIGS. 2A, 3A, 4A, 5A, 6~11, should be understood similarly.

As illustrated in FIG. 1B, two or more standard cells are configured in a cascade mode. Each standard cell is bordered by two dielectric gates 114. This cascaded standard cells end on two dielectric gates 114 at the furthest edges (left edge and right edge). The active regions are extending along the Y direction to the furthest edges. In the present embodiment, those two edge dielectric gates 114 are configured differently from dielectric gates within the cascaded standard cells. Each of the edge dielectric gates 114 is partially landing on the isolation feature and is partially landing on the active region 106. This structure is also referred to as continuous poly on diffusion edge (CPODE).

Figure 2A:
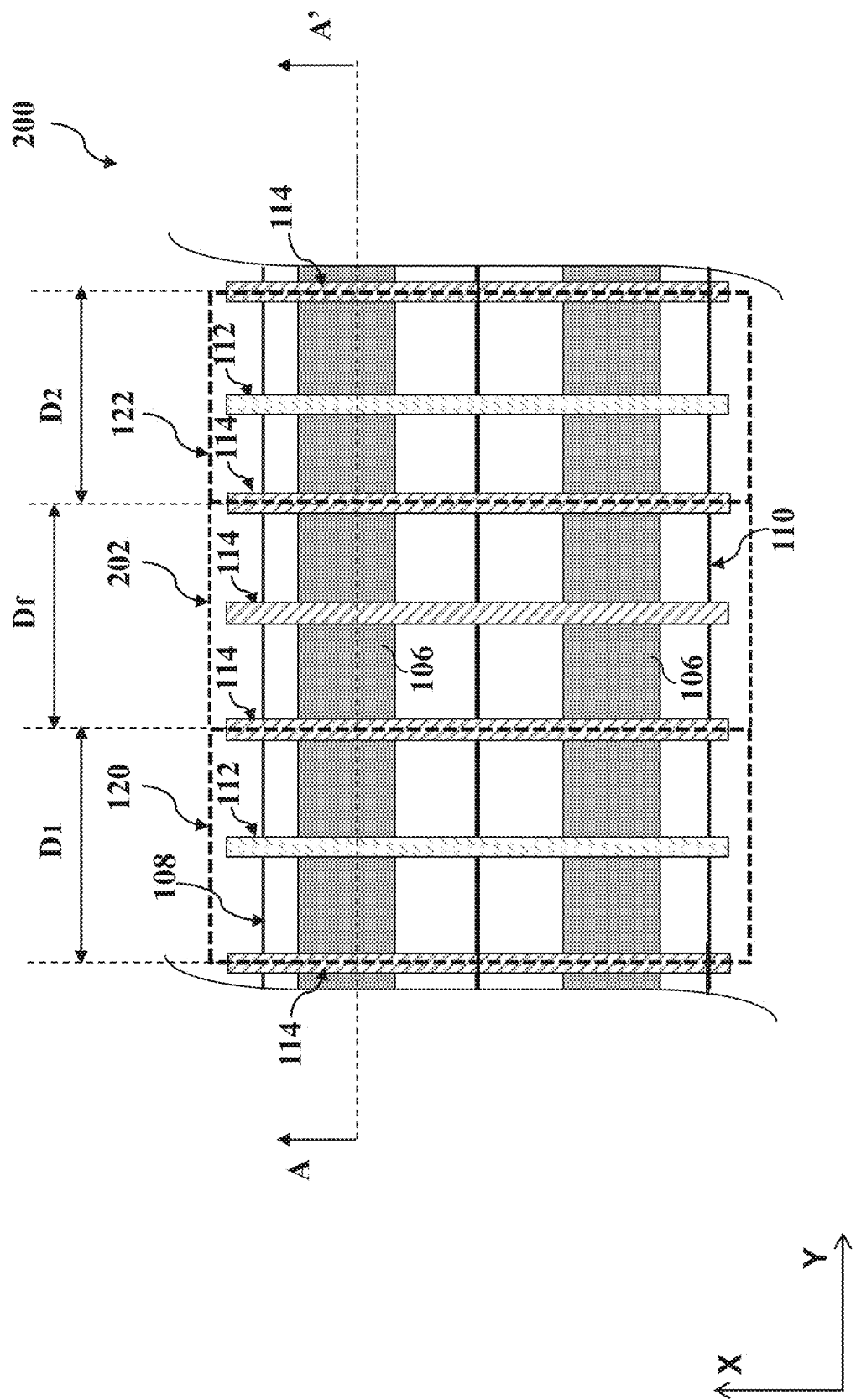
FIG. 2A is a top view of an IC structure constructed according to various aspects of the present disclosure in one embodiment.
Figure 2B:
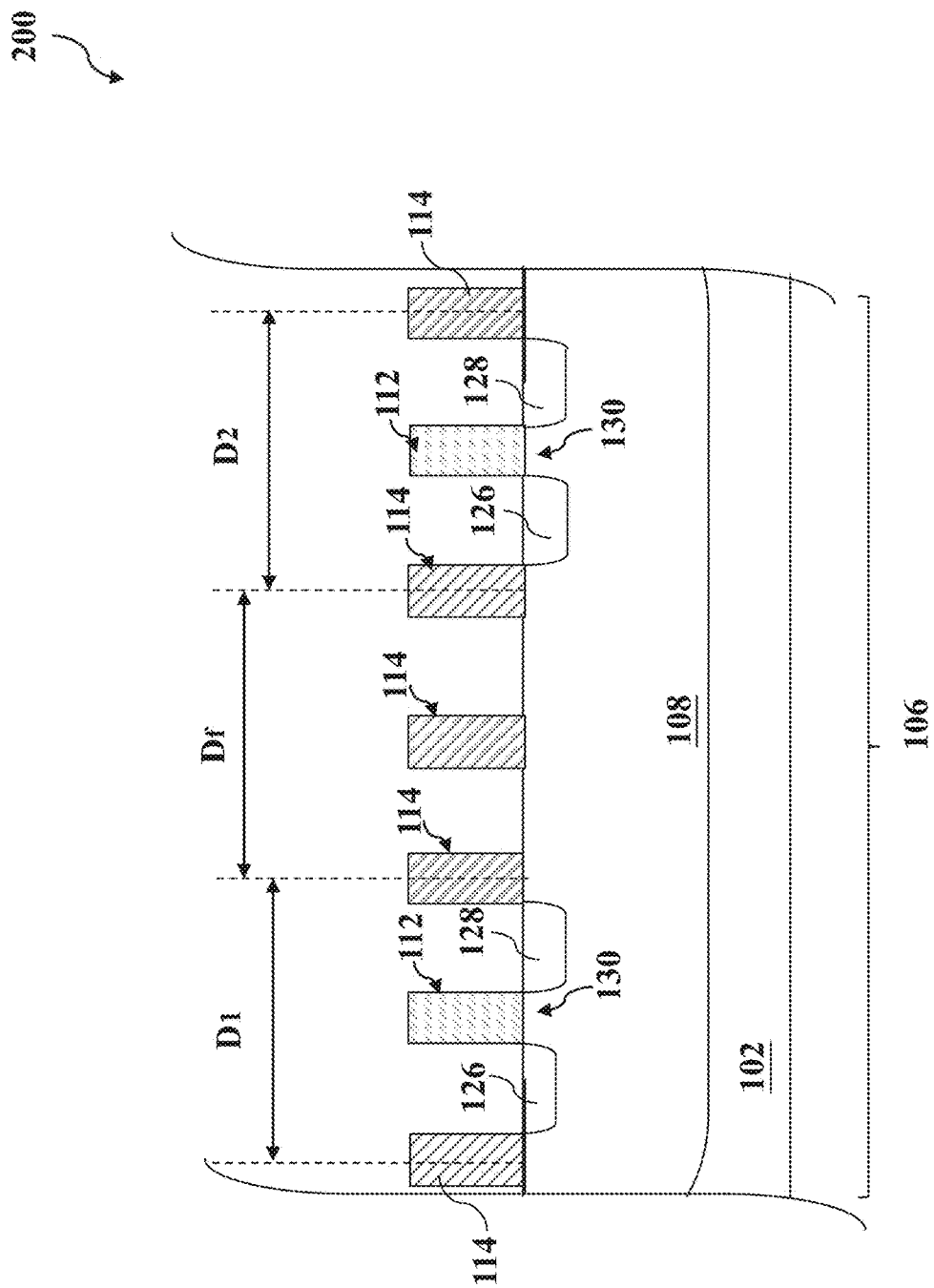
FIG. 2B is a sectional view of the IC structure of FIG. 2A, constructed according to various aspects of the present disclosure in one embodiment.

FIG. 2A is a top view of an IC structure 200 constructed according to other embodiments. FIG. 2B is a sectional view of the IC structure 200 along the dashed line AA'. The IC structure 200 is similar to the IC structure 100 in FIGS. 1A and 1B. For example, the IC structure 200 also includes dielectric gates 114 formed on boundary lines of the standard cells (such as 120 and 122); the standard cells are separated by a filler cell; and the adjacent standard cells are formed on continuous active regions 106. Each gate 112 is next to a dielectric gate 114. Since the active regions are continuous, the isolation between transistors is achieved by the dielectric gates 114. However, the filler cell 202 in the IC structure 200 is different from the filler cell 124 in the IC structure 100. The filler cell 202 adjoins the first standard cell 120 on one dielectric gate 114 and adjoins the second standard cell 122 on another dielectric gate 114. The filler cell 202 includes an additional dielectric gate 114. All gates 112 and the dielectric gates 114 are equally configured with a pitch P. In other words, the distance between the adjacent gates (including the dielectric gates 114 and the gates 112) is P. The filler cell 202 spans a dimension $D_f=2*P$ along the Y direction. In this case, the dimension of the filler cell 202 is $D_1=D_2=D_f=2*P$.

Figure 3A:
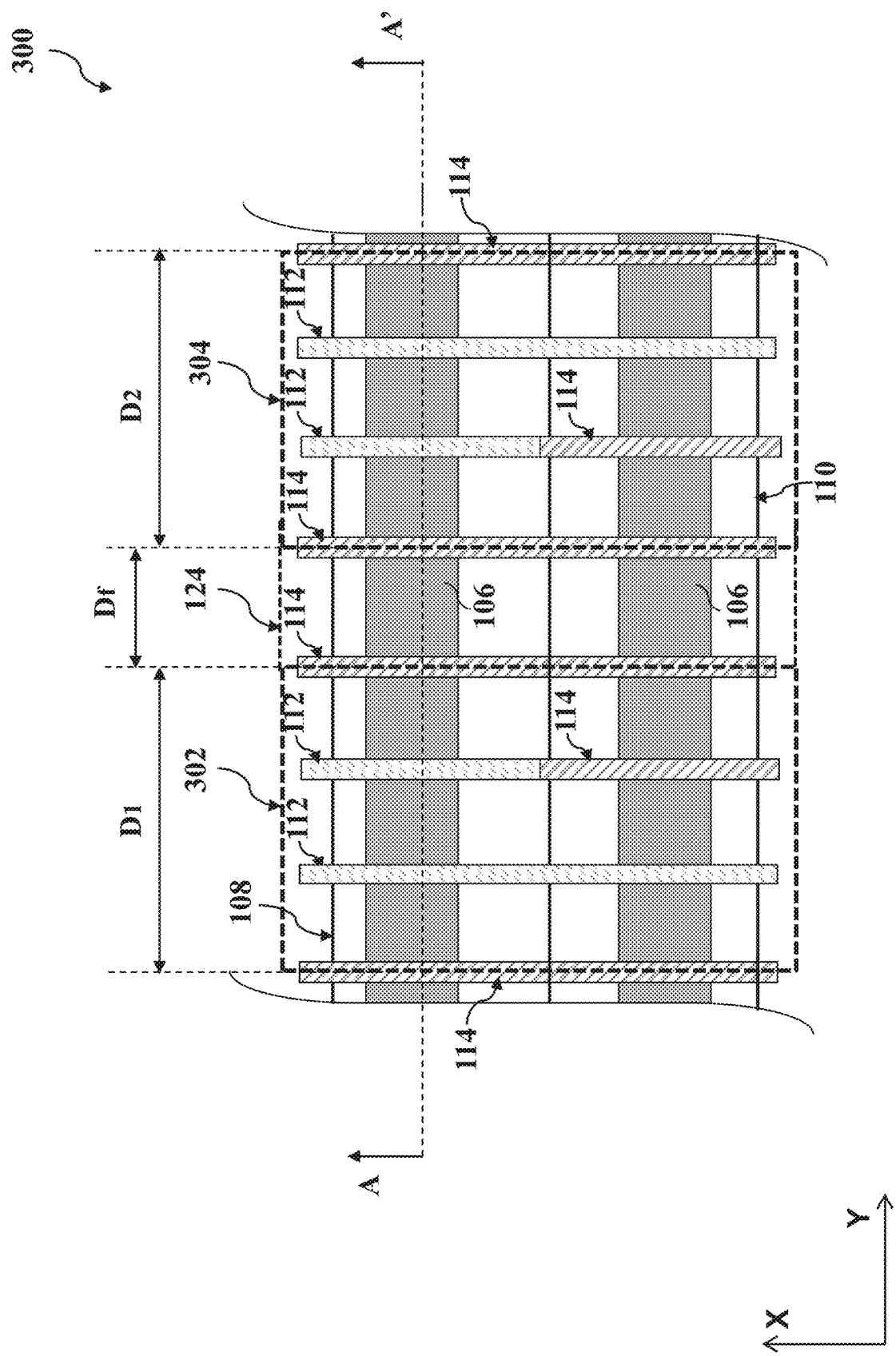
FIG. 3A is a top view of an IC structure constructed according to various aspects of the present disclosure in one embodiment.
Figure 3B:
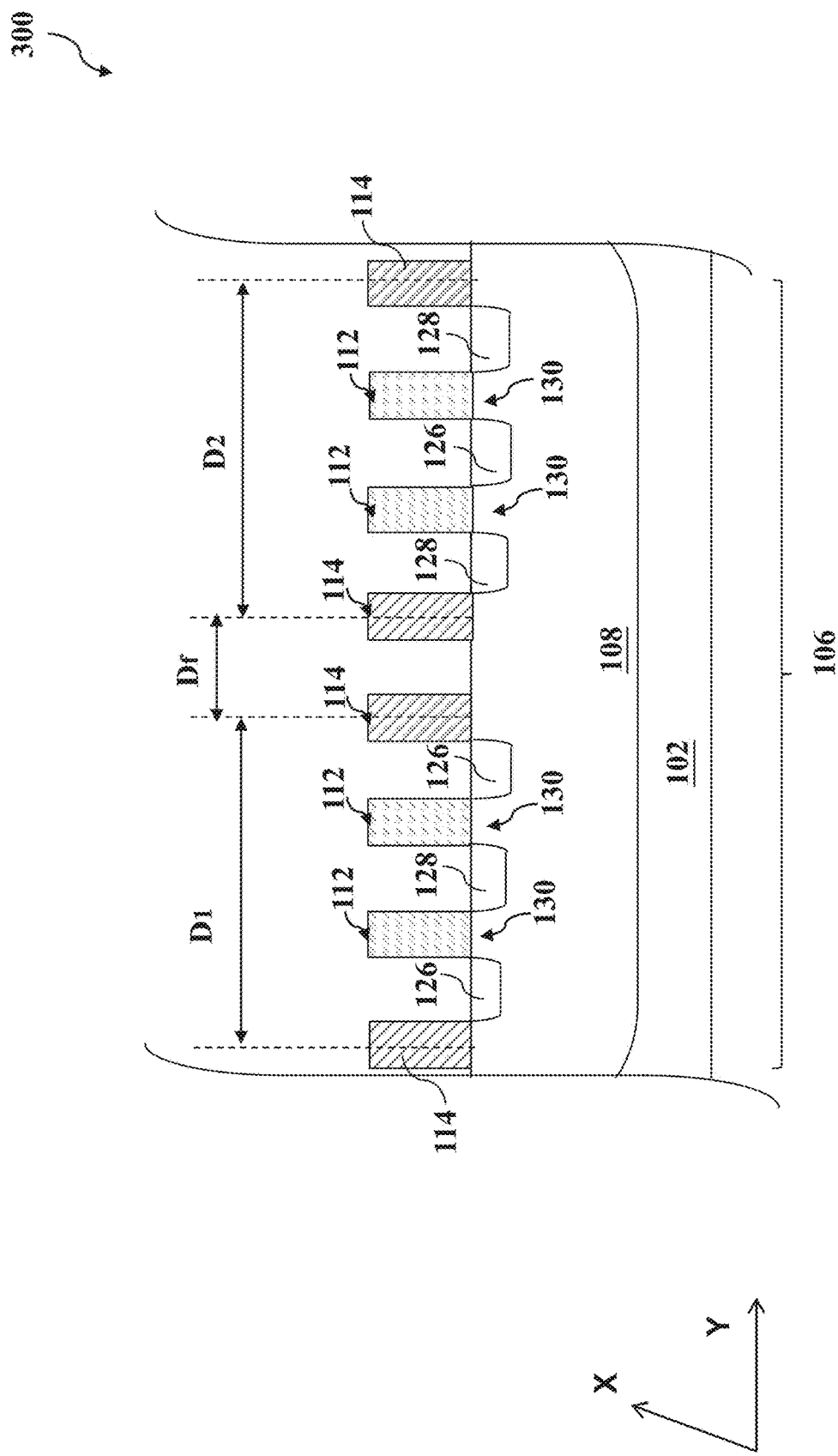
FIG. 3B is a sectional view of the IC structure of FIG. 3A, constructed according to various aspects of the present disclosure in one embodiment.

FIG. 3A is a top view of an IC structure 300 constructed according to other embodiments. FIG. 3B is a sectional view of the IC structure 300 along the dashed line AA'. The IC structure 300 is similar to the IC structure 100 in FIGS. 1A and 1B. For example, the IC structure 300 also includes dielectric gates 114 formed on boundary lines of the standard cells; the standard cells are separated by a filler cell with a one pitch dimension; and the adjacent standard cells are formed on continuous active regions 106. Each gate 112 is next to a dielectric gate 114. Since the active regions are continuous, the isolation between transistors is achieved by the dielectric gates 114. The gates 112 and the dielectric gates 114 are configured along the Y direction with an equal distance P to its adjacent ones. Here the distance is measured from center to center. In other words, the distance between the adjacent gates (including the dielectric gates 114 and the gates 112) is P. The IC structure 300 includes a first standard cell 302 and a second standard cell 304 separated by the filler cell 124. The filler cell 124 spans along the Y direction a dimension $D_f=P$; the first standard cell 302 spans along the Y direction a dimension $D_1=3*P$; and the second standard cell 304 spans along the Y direction a dimension $D_2=3*P$. In this case, $D_1=D_2=3*D_f=3*P$.

However, the first standard cell 302 and the second standard cell 304 in the IC structure 300 are different from the standard cells in the IC structure 100. The standard cell 302 (or 304) in the IC structure 300 includes two gates 112 configured in parallel. The first gate 112 in the first standard cell 302 is extending from the first active region 106 within the N well 108 to the second active region within the P well 110 along the X direction. The second gate 112 in the first standard cell 302 is disposed on the first active region 106 within the N well 108 and is not extended to the second active region within the P well 110. Furthermore, the first standard cell 302 includes a dielectric gate 114 disposed inside the cell not on the cell boundary lines. Therefore this dielectric gate is referred to as in-cell dielectric gate 114. The in-cell dielectric gate 114 within the first standard cell 302 is disposed on the second active region 106 within the P well 110. The in-cell dielectric gate 114 is aligned with and directly contacts the second gate 112 within the first standard cell 302.

The second standard cell 304 is similar to the first standard cell 302. The first gate 112 in the second standard cell 304 is extending from the first active region 106 within the N well 108 to the second active region within the P well 110 along the X direction. However, the second gate 112 in the second standard cell 304 is also disposed on the first active region 106 within the N well 108 and is not extended to the second active region within the P well 110. The second standard cell 304 includes an in-cell dielectric gate 114 disposed inside the cell not on the cell boundary lines. The in-cell dielectric gate 114 inside the second standard cell 304 is disposed on the second active region 106 within the P well 110. The in-cell dielectric gate 114 inside the second standard cell 304 is aligned with and directly contacts the second gate 112 within the second standard cell 304.

Thus, in the IC structure 300, the first standard cell 302 includes 2 pFETs and 1 nFET while the second standard cell 304 includes 2 pFETs and 1 nFET. Overall, the first and second standard cells in the IC structure 300 collectively include 4 pFETs and 2 nFETs.

Figure 4A:
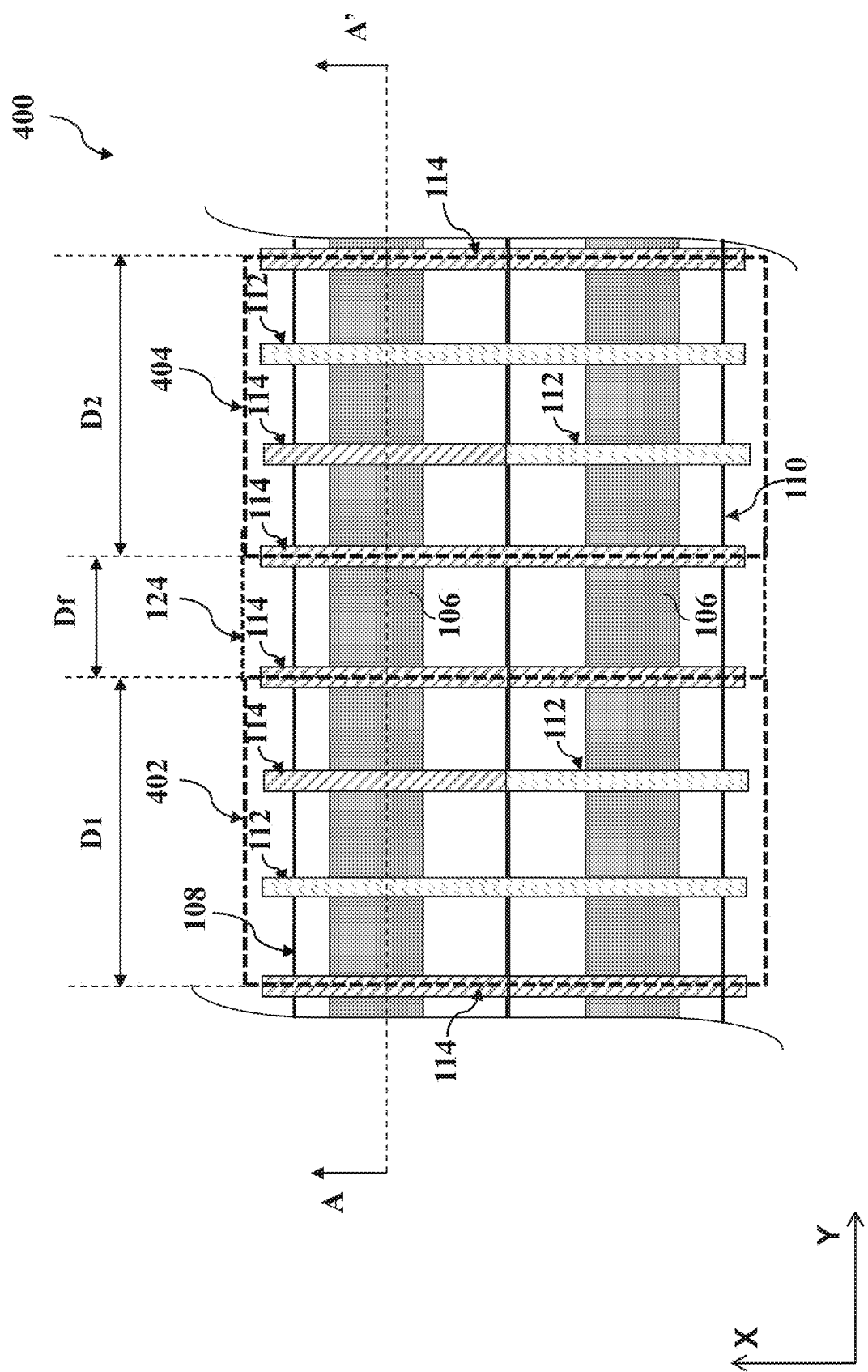
FIG. 4A is a top view of an IC structure constructed according to various aspects of the present disclosure in one embodiment.
Figure 4B:
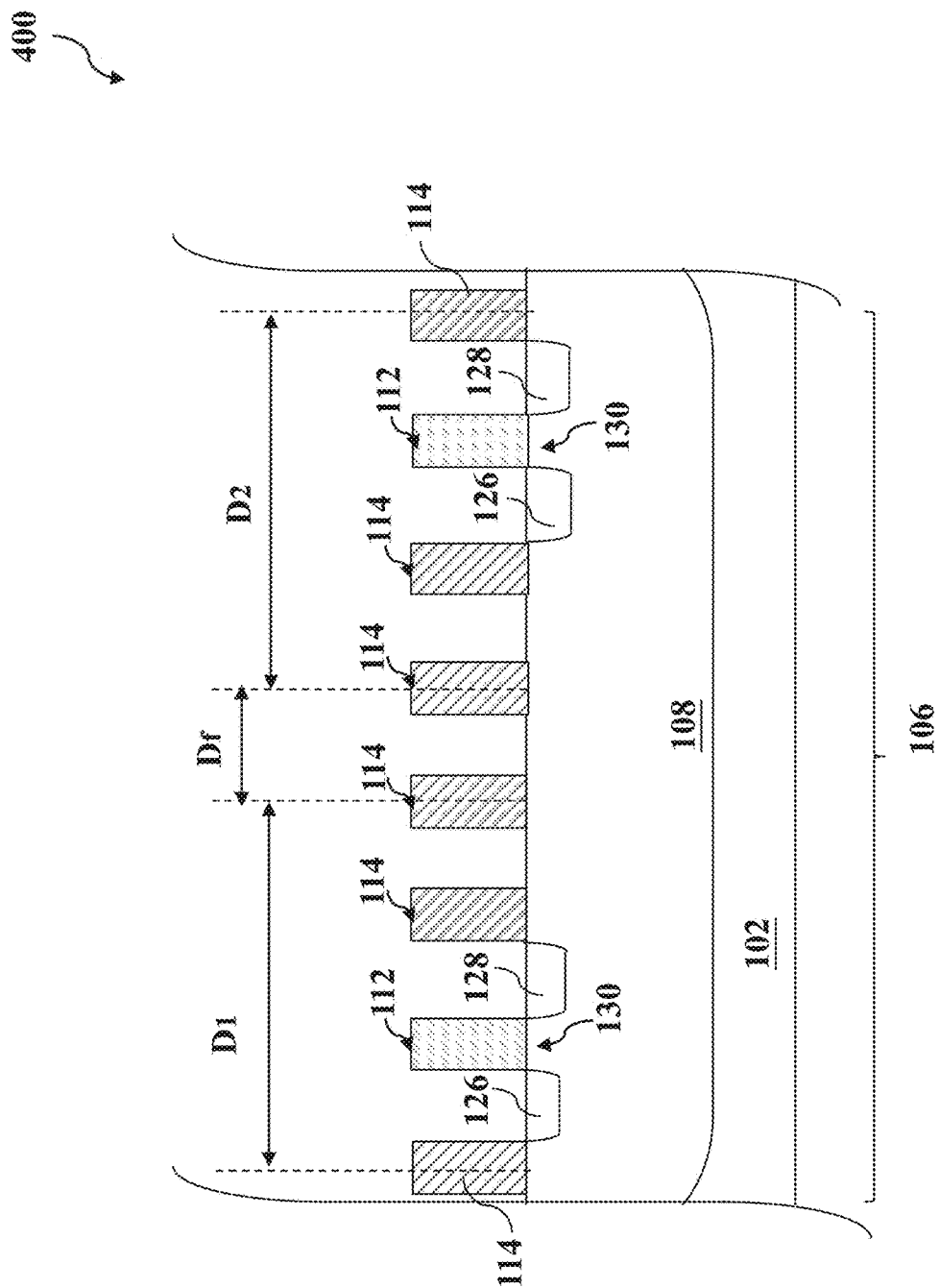
FIG. 4B is a sectional view of the IC structure of FIG. 4A, constructed according to various aspects of the present disclosure in one embodiment.

FIG. 4A is a top view of an IC structure 400 constructed according to other embodiments. FIG. 4B is a sectional view of the IC structure 400 along the dashed line AA'. The IC structure 400 is similar to the IC structure 100 in FIGS. 1A and 1B. For example, the IC structure 400 also includes dielectric gates 114 formed on boundary lines of the standard cells; the standard cells are separated by a filler cell with a one pitch dimension; and the adjacent standard cells are formed on continuous active regions 106. Each gate 112 is next to a dielectric gate 114. Since the active regions are continuous, the isolation between transistors is achieved by the dielectric gates 114. The gates 112 and the dielectric gates 114 are configured along the Y direction with an equal distance P to its adjacent ones. In other words, the distance between the adjacent gates (including the dielectric gates 114 and the gates 112) is P. The IC structure 400 includes a first standard cell 402 and a second standard cell 404 separated by the filler cell 124. The filler cell 124 spans along the Y direction a dimension $D_f=P$; the first standard cell 402 spans along the Y direction a dimension $D_1=3*P$; and the second standard cell 404 spans along the Y direction a dimension $D_2=3*P$. In this case, $D_1=D_2=3*D_f=3*P$.

However, the first standard cell 402 and the second standard cell 404 in the IC structure 400 are different from the standard cells in the IC structure 100. The standard cell 402 (or 404) in the IC structure 400 includes two gates 112 configured in parallel. The first gate 112 in the first standard cell 402 is extending from the first active region 106 within the N well 108 to the second active region within the P well 110 along the X direction. The second gate 112 in the first standard cell 402 is disposed on the second active region 106 within the P well 110 and is not extended to the first active region within the N well 108. Furthermore, the first standard cell 402 includes an in-cell dielectric gate 114 disposed inside the cell not on the cell boundary lines. The in-cell dielectric gate 114 within the first standard cell 402 is disposed on the first active region 106 within the N well 108. The in-cell dielectric gate 114 within the first standard cell 402 is aligned with and directly contacts the second gate 112 within the first standard cell 402.

As to the second standard cell 404, the first gate 112 in the second standard cell 404 is extending from the first active region 106 within the N well 108 to the second active region within the P well 110 along the X direction. The second gate 112 in the second standard cell 404 is disposed on the second active region 106 within the P well 110 and is not extended to the first active region within the N well 108. The second standard cell 404 includes an in-cell dielectric gate 114 disposed inside the cell not on the cell boundary lines. The in-cell dielectric gate 114 is disposed on the first active region 106 within the N well 108. The in-cell dielectric gate 114 within the second standard cell 404 is aligned with and directly contacts the second gate 112 within the second standard cell 404.

Thus, in the IC structure 400, the first standard cell 402 includes 1 pFET and 2 nFETs while the second standard cell 404 includes 1 pFET and 2 nFETs. Overall, the first and second standard cells in the IC structure 400 collectively include 2 pFETs and 4 nFETs.

Figure 5A:
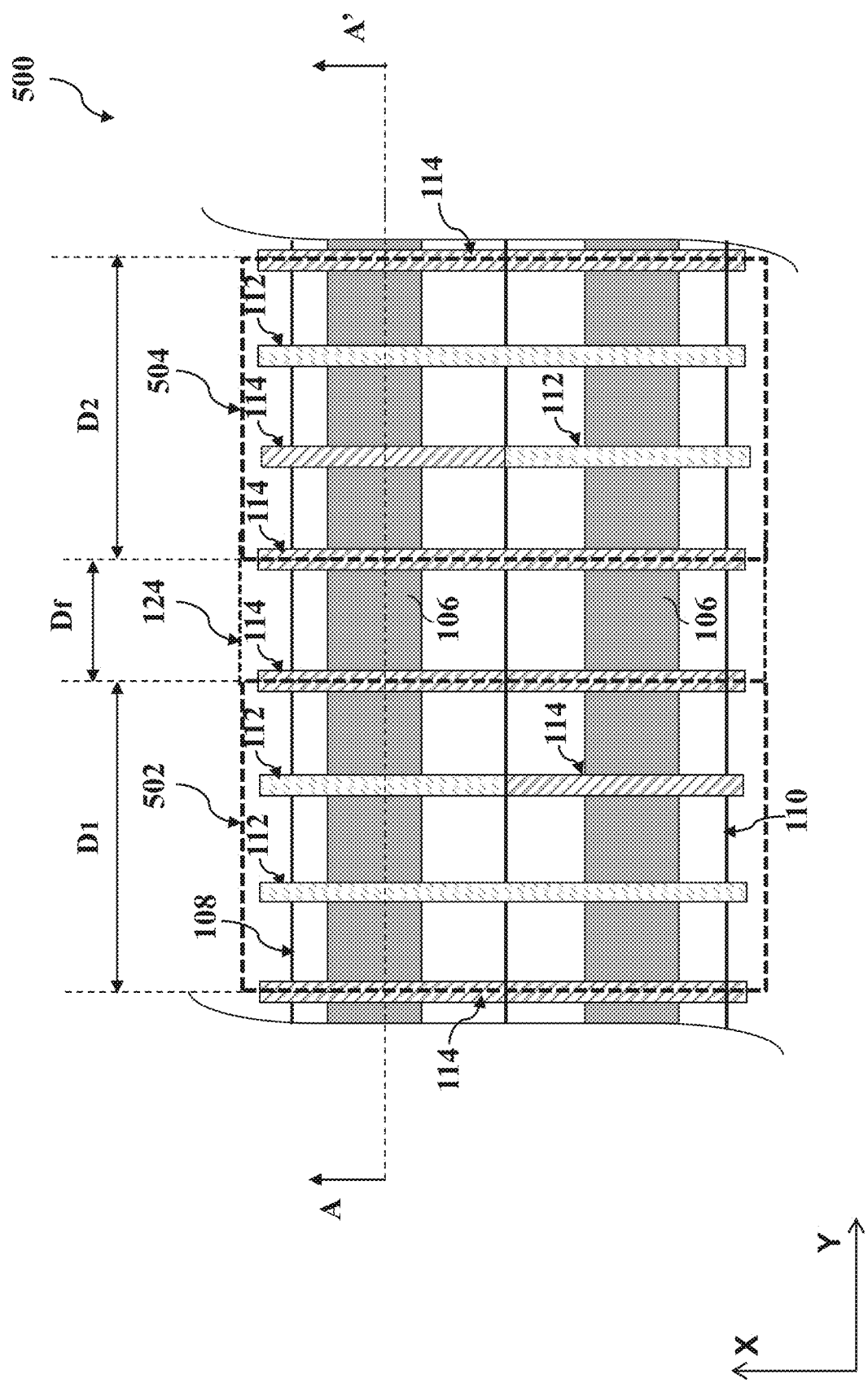
FIG. 5A is a top view of an IC structure constructed according to various aspects of the present disclosure in one embodiment.
Figure 5B:
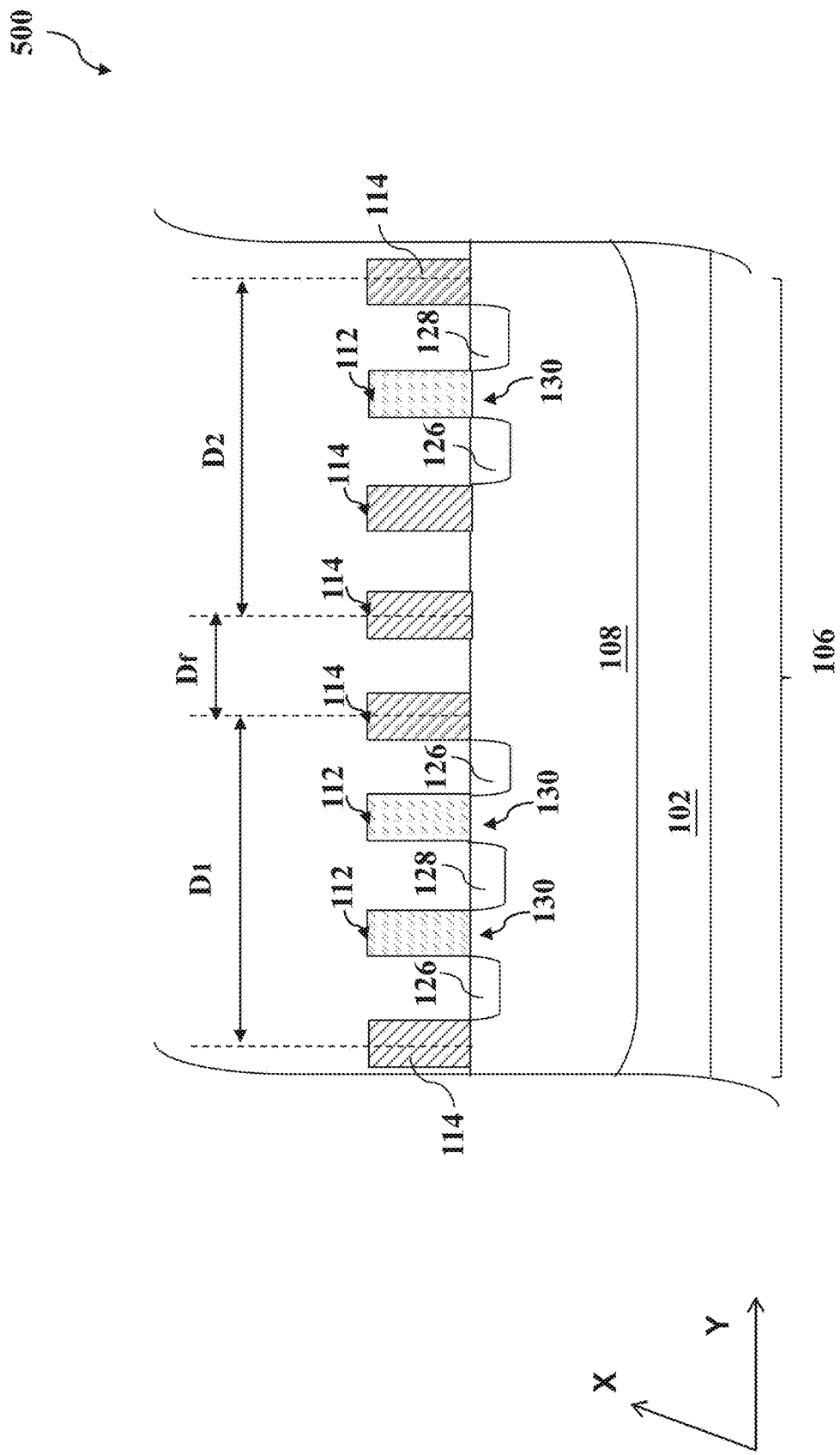
FIG. 5B is a sectional view of the IC structure of FIG. 5A, constructed according to various aspects of the present disclosure in one embodiment.

FIG. 5A is a top view of an IC structure 500 constructed according to other embodiments. FIG. 5B is a sectional view of the IC structure 500 along the dashed line AA'. The IC structure 500 is similar to the IC structure 100 in FIGS. 1A and 1B. For example, the IC structure 500 also includes dielectric gates 114 formed on boundary lines of the standard cells; the standard cells are separated by a filler cell with a one pitch dimension; and the adjacent standard cells are formed on continuous active regions 106. Each gate 112 is next to a dielectric gate 114. Since the active regions are continuous, the isolation between transistors is achieved by the dielectric gates 114. The gates 112 and the dielectric gates 114 are configured along the Y direction with an equal distance P to its adjacent ones. In other words, the distance between the adjacent gates (including the dielectric gates 114 and the gates 112) is P. The IC structure 500 includes a first standard cell 502 and a second standard cell 504 separated by the filler cell 124. The filler cell 124 spans along the Y direction a dimension $P_f=P$; the first standard cell 502 spans along the Y direction a dimension $D_1=3*P$; and the second standard cell 504 spans along the Y direction a dimension $D_2=3*P$. In this case, $D_1=D_2=3*D_f=3*P$.

However, the first standard cell 502 and the second standard cell 504 in the IC structure 500 are different from the standard cells in the IC structure 100. The standard cell 502 (or 504) in the IC structure 500 includes two gates 112 configured in parallel. The first gate 112 in the first standard cell 502 is extending from the first active region 106 within the N well 108 to the second active region within the P well 110 along the X direction. The second gate 112 in the first standard cell 502 is disposed on the first active region 106 within the N well 108 and is not extended to the second active region within the P well 110. Furthermore, the first standard cell 502 includes an in-cell dielectric gate 114 disposed inside the cell not on the cell boundary lines. The in-cell dielectric gate 114 within the first standard cell 502 is disposed on the second active region 106 within the P well 110. The in-cell dielectric gate 114 within the first standard cell 502 is aligned with and directly contacts the second gate 112 within the first standard cell 502.

As to the second standard cell 504, the first gate 112 in the second standard cell 504 is extending from the first active region 106 within the N well 108 to the second active region within the P well 110 along the X direction. The second gate 112 in the second standard cell 504 is disposed on the second active region 106 within the P well 110 and is not extended to the first active region within the N well 108. The second standard cell 504 includes an in-cell dielectric gate 114 disposed inside the cell not on the cell boundary lines. The in-cell dielectric gate 114 is disposed on the first active region 106 within the N well 108. The in-cell dielectric gate 114 within the second standard cell 504 is aligned with and directly contacts the second gate 112 within the second standard cell 504.

Thus, in the IC structure 500, the first standard cell 502 includes 2 pFETs and 1 nFET while the second standard cell 504 includes 1 pFET and 2 nFETs. Overall, the first and second standard cells in the IC structure 500 collectively include 3 pFETs and 3 nFETs.

Figure 6:
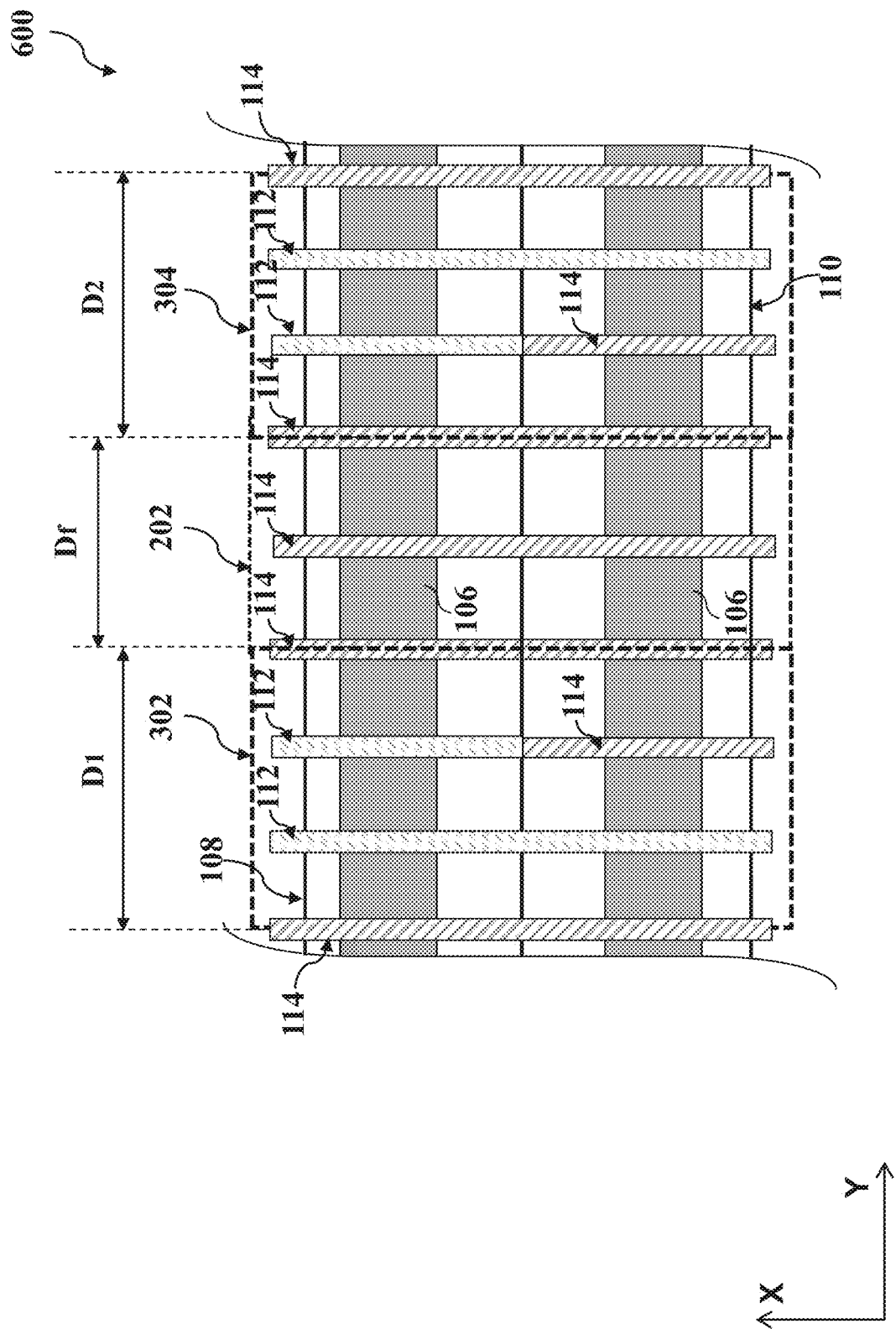
FIGS. 6, 7, 8, 9, 10, and 11 are top views of an IC structure constructed according to various embodiments.

FIG. 6 is a top view of an IC structure 600 constructed according to other embodiments. The IC structure 600 is similar to the IC structure 300 in FIGS. 3A and 3B. For example, the IC structure 600 also includes dielectric gates 114 formed on boundary lines of the standard cells; each gate 112 is next to a dielectric gate 114. Since the active regions are continuous, the isolation between transistors is achieved by the dielectric gates 114. The gates 112 and the dielectric gates 114 are configured along the Y direction with an equal distance P to its adjacent ones. In other words, the distance between the adjacent gates (including the dielectric gates 114 and the gates 112) is P. The IC structure 600 includes a first standard cell 302 and a second standard cell 304 separated by the filler cell 202. The filler cell 202 spans along the Y direction a dimension $D_f=2*P$; the first standard cell 302 spans along the Y direction a dimension $D_1=3*P$; and the second standard cell 304 spans along the Y direction a dimension $D_2=3*P$. In this case, $D_1=D_2=3*P$ and $D_f=2*P$.

Thus, in the IC structure 600, the first standard cell 302 includes 2 pFETs and 1 nFET while the second standard cell 304 includes 2 pFETs and 1 nFET. Overall, the first and second standard cells in the IC structure 600 collectively include 4 pFETs and 2 nFETs.

Figure 7:
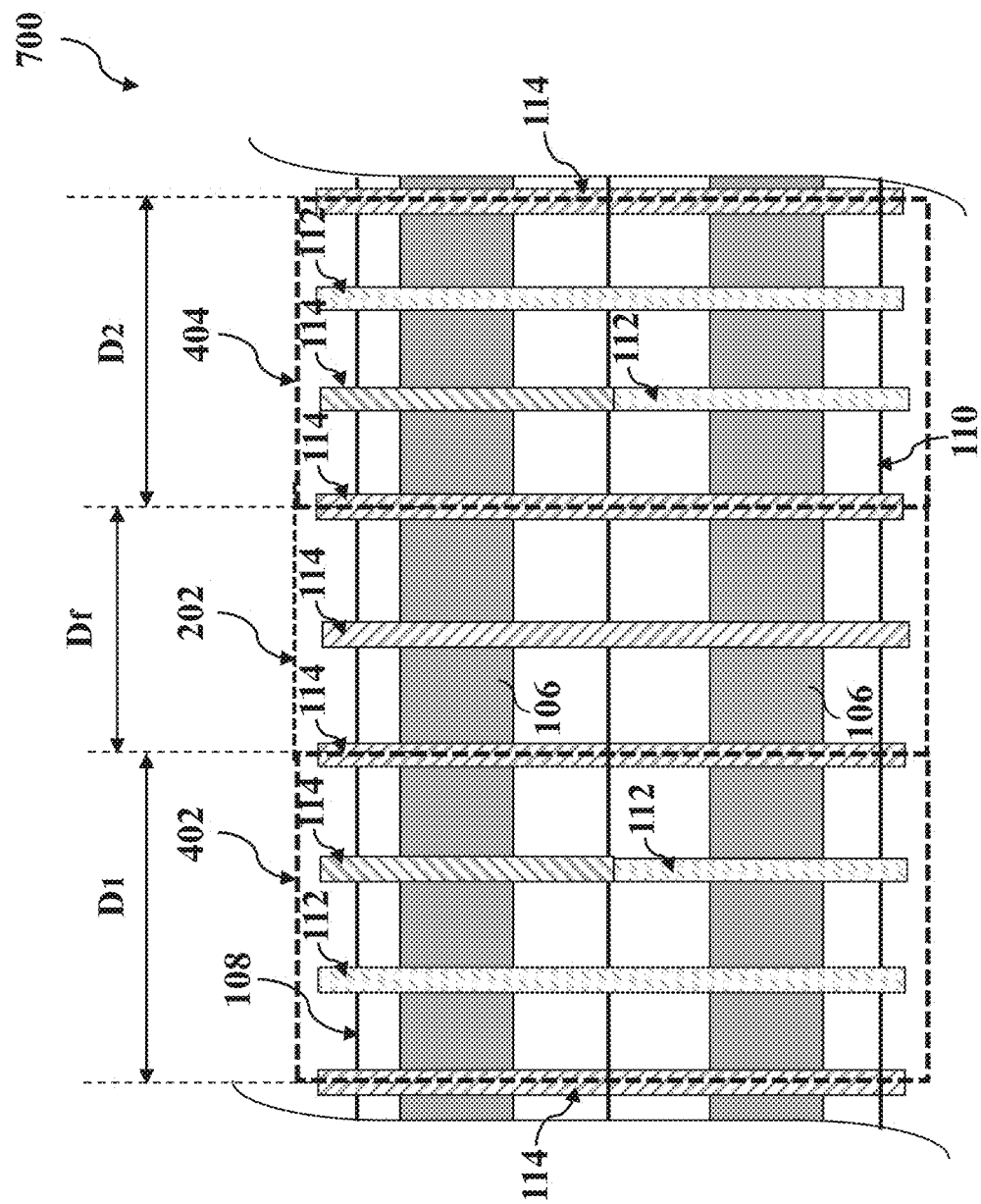

FIG. 7 is a top view of an IC structure 700 constructed according to other embodiments. The IC structure 700 is similar to the IC structure 400 in FIGS. 4A and 4B. For example, the IC structure 700 also includes dielectric gates 114 formed on boundary lines of the standard cells; each gate 112 is next to a dielectric gate 114. Since the active regions are continuous, the isolation between transistors is achieved by the dielectric gates 114. The gates 112 and the dielectric gates 114 are configured along the Y direction with an equal distance P to its adjacent ones. In other words, the distance between the adjacent gates (including the dielectric gates 114 and the gates 112) is P. The IC structure 700 includes a first standard cell 402 and a second standard cell 404 separated by the filler cell 202. The filler cell 202 spans along the Y direction a dimension $D_f=2*P$; the first standard cell 402 spans along the Y direction a dimension $D_1=3*P$; and the second standard cell 404 spans along the Y direction a dimension $D_2=3*P$. In this case, $D_1=D_2=3*P$ and $D_f=2*P$.

Thus, in the IC structure 700, the first standard cell 402 includes 1 pFET and 2 nFETs while the second standard cell 404 includes 1 pFET and 2 nFETs. Overall, the first and second standard cells in the IC structure 700 collectively include 2 pFETs and 4 nFETs.

Figure 8:
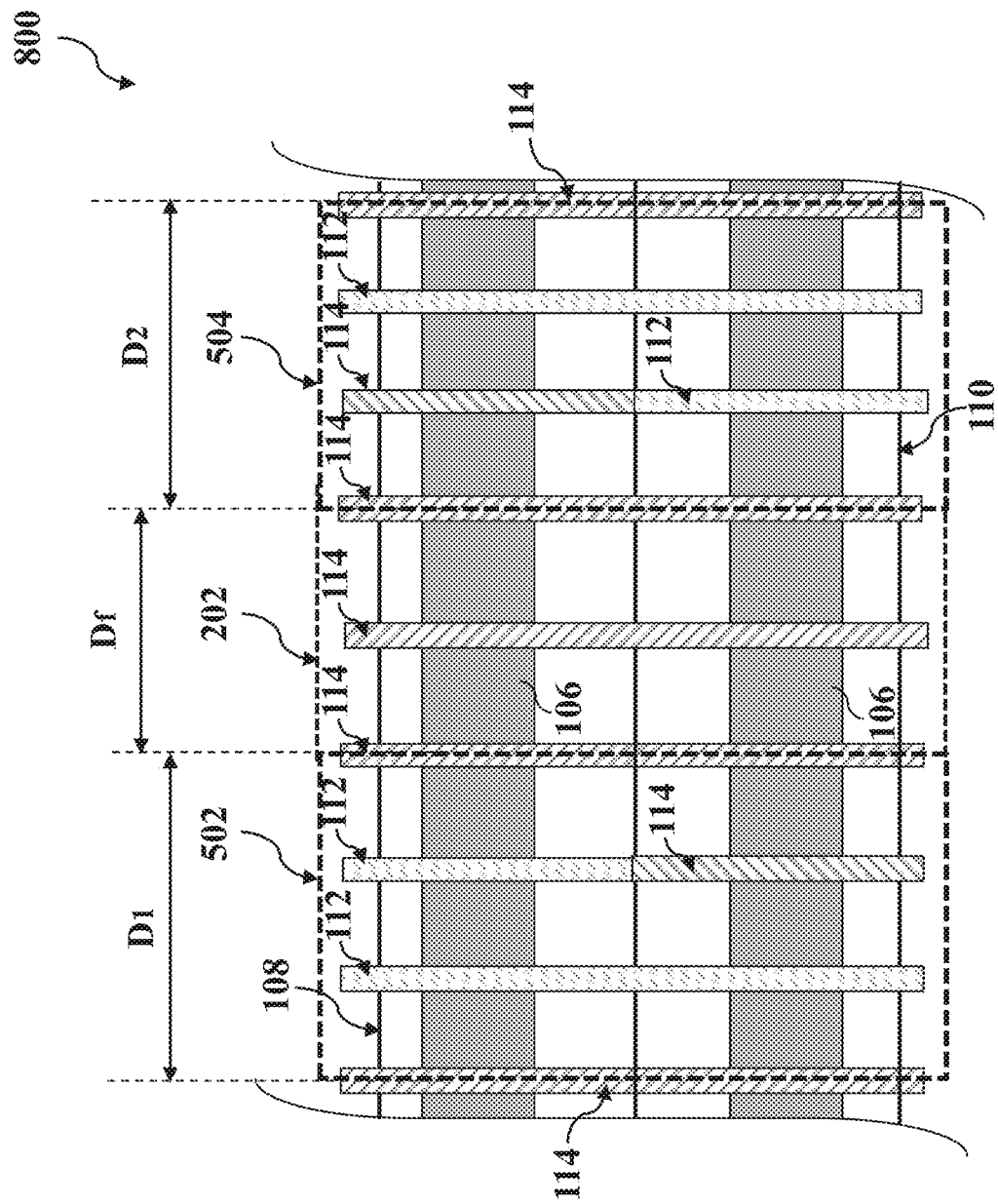

FIG. 8 is a top view of an IC structure 800 constructed according to other embodiments. The IC structure 800 is similar to the IC structure 500 in FIGS. 5A and 5B. For example, the IC structure 800 also includes dielectric gates 114 formed on boundary lines of the standard cells; each gate 112 is next to a dielectric gate 114. Since the active regions are continuous, the isolation between transistors is achieved by the dielectric gates 114. The gates 112 and the dielectric gates 114 are configured along the Y direction with an equal distance P to its adjacent ones. In other words, the distance between the adjacent gates (including the dielectric gates 114 and the gates 112) is P. The IC structure 800 includes a first standard cell 502 and a second standard cell 504 separated by the filler cell 202. The filler cell 202 spans along the Y direction a dimension $D_f=2*P$; the first standard cell 502 spans along the Y direction a dimension $D_1=3*P$; and the second standard cell 504 spans along the Y direction a dimension $D_2=3*P$. In this case, $D_1=D_2=3*P$ and $D_f=2*P$.

Thus, in the IC structure 800, the first standard cell 502 includes 2 pFETs and 1 nFET while the second standard cell 504 includes 1 pFET and 2 nFETs. Overall, the first and second standard cells in the IC structure 800 collectively include 3 pFETs and 3 nFETs.

Figure 9:
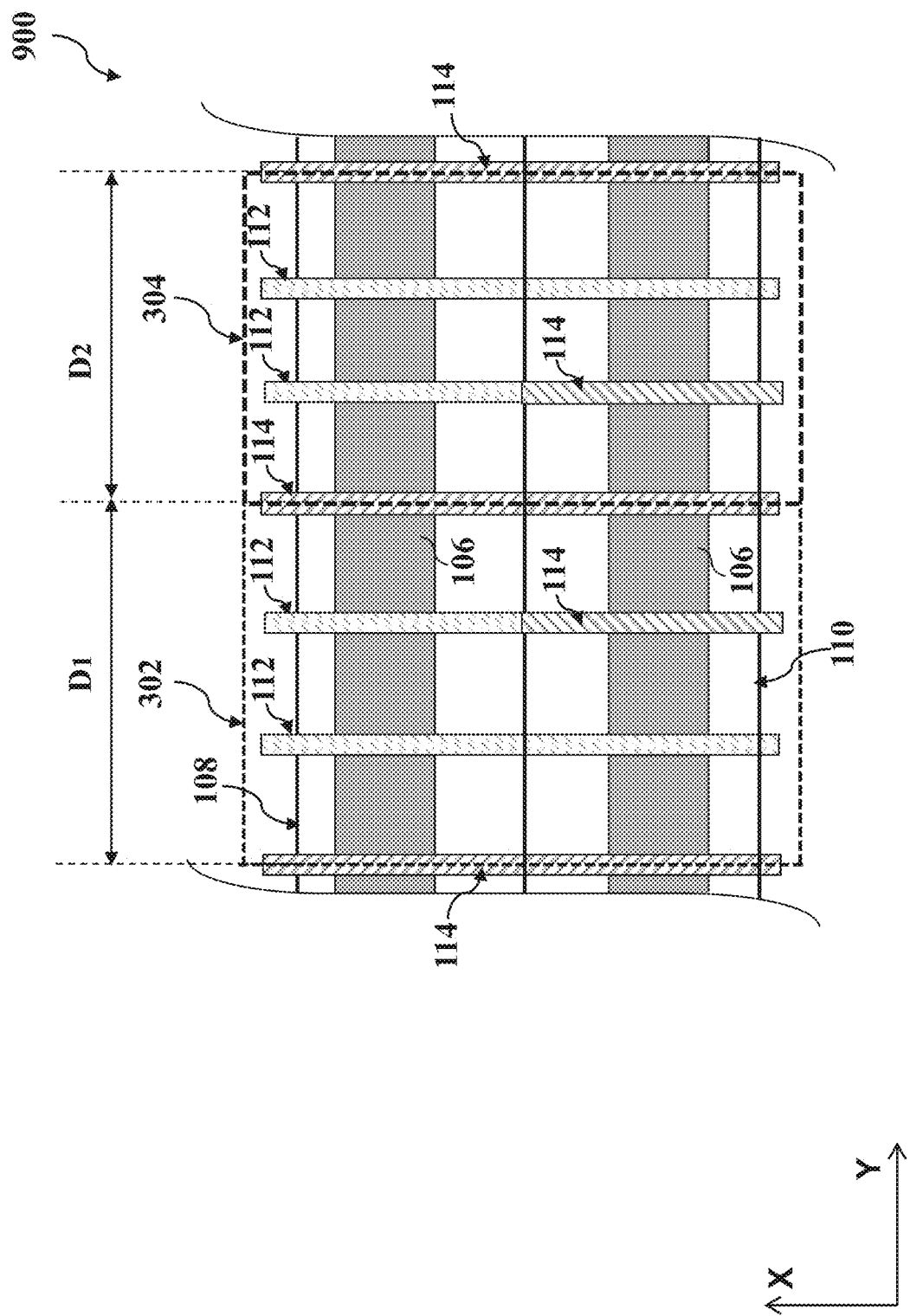

FIG. 9 is a top view of an IC structure 900 constructed according to other embodiments. The IC structure 900 is similar to the IC structure 300 in FIGS. 3A and 3B. For example, the IC structure 900 also includes dielectric gates 114 formed on boundary lines of the standard cells; each gate 112 is next to a dielectric gate 114. Since the active regions are continuous, the isolation between transistors is achieved by the dielectric gates 114. The gates 112 and the dielectric gates 114 are configured along the Y direction with an equal distance P to its adjacent ones. In other words, the distance between the adjacent gates (including the dielectric gates 114 and the gates 112) is P. The IC structure 900 includes a first standard cell 302 and a second standard cell 304 adjoined at a dielectric gate 114. The first standard cell 302 spans along the Y direction a dimension $D_1=3*P$; and the second standard cell 304 spans along the Y direction a dimension $D_2=3*P$. In this case, $D_1=D_2=3*P$.

Thus, in the IC structure 900, the first standard cell 302 includes 2 pFETs and 1 nFET while the second standard cell 304 includes 2 pFETs and 1 nFET. Overall, the first and second standard cells in the IC structure 900 collectively include 4 pFETs and 2 nFETs.

Figure 10:
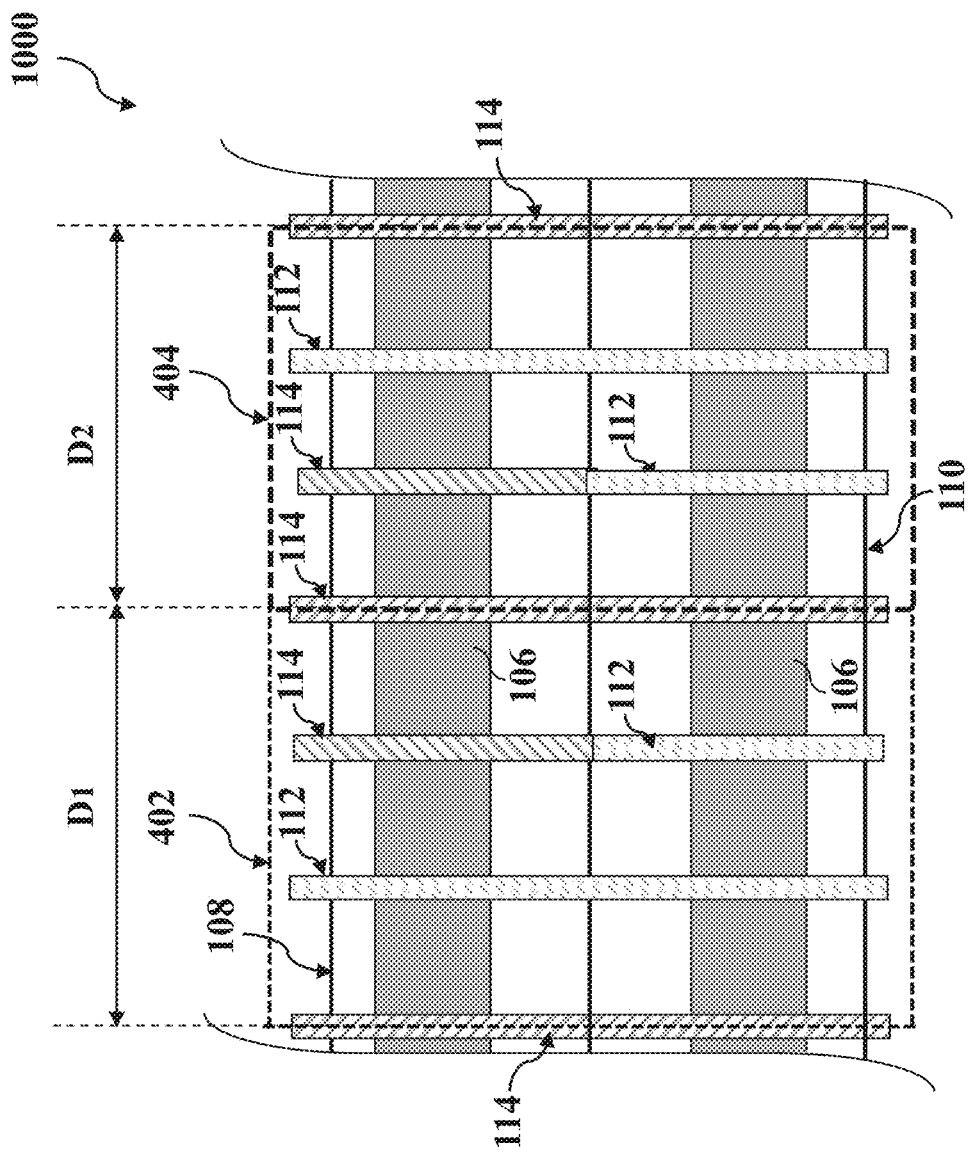

FIG. 10 is a top view of an IC structure 1000 constructed according to other embodiments. The IC structure 1000 is similar to the IC structure 400 in FIGS. 4A and 4B. For example, the IC structure 1000 also includes dielectric gates 114 formed on boundary lines of the standard cells; each gate 112 is next to a dielectric gate 114. Since the active regions are continuous, the isolation between transistors is achieved by the dielectric gates 114. The gates 112 and the dielectric gates 114 are configured along the Y direction with an equal distance P to its adjacent ones. In other words, the distance between the adjacent gates (including the dielectric gates 114 and the gates 112) is P. The IC structure 1000 includes a first standard cell 402 and a second standard cell 404 adjoined at a dielectric gate. The first standard cell 402 spans along the Y direction a dimension $D_1=3*P$; and the second standard cell 404 spans along the Y direction a dimension $D_2=3*P$. In this case, $D_1=D_2=3*P$.

Thus, in the IC structure 1000, the first standard cell 402 includes 1 pFET and 2 nFETs while the second standard cell 404 includes 1 pFET and 2 nFETs. Overall, the first and second standard cells in the IC structure 1000 collectively include 2 pFETs and 4 nFETs.

Figure 11:
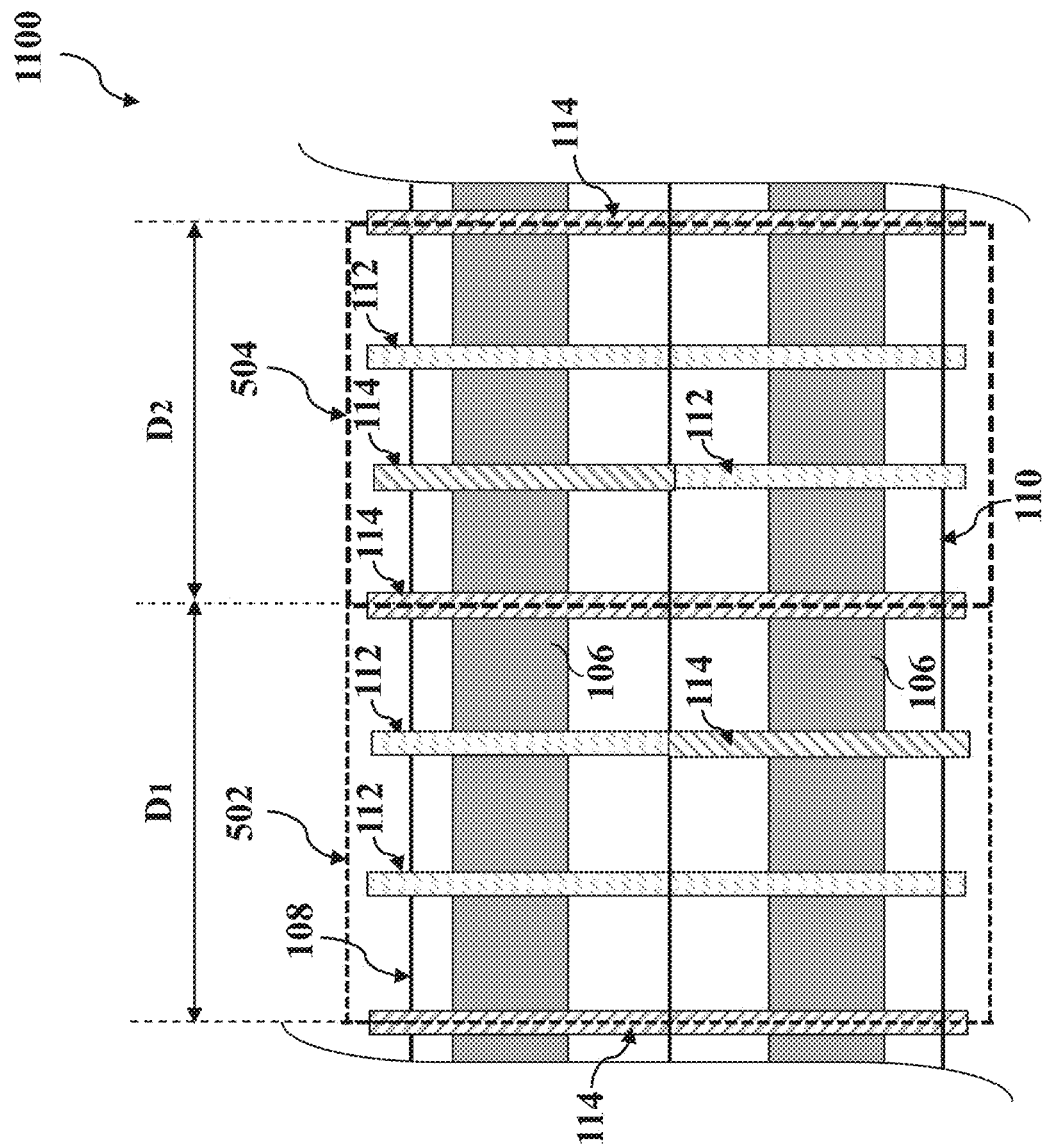

FIG. 11 is a top view of an IC structure 1100 constructed according to other embodiments. The IC structure 1100 is similar to the IC structure 500 in FIGS. 5A and 5B. For example, the IC structure 1100 also includes dielectric gates 114 formed on boundary lines of the standard cells; each gate 112 is next to a dielectric gate 114. Since the active regions are continuous, the isolation between transistors is achieved by the dielectric gates 114. The gates 112 and the dielectric gates 114 are configured along the Y direction with an equal distance P to its adjacent ones. In other words, the distance between the adjacent gates (including the dielectric gates 114 and the gates 112) is P. The IC structure 1100 includes a first standard cell 502 and a second standard cell 504 adjoined at a dielectric gate 114. The first standard cell 502 spans along the Y direction a dimension $D_1=3*P$; and the second standard cell 504 spans along the Y direction a dimension $D_2=3*P$. In this case, $D_1=D_2=3*P$.

Thus, in the IC structure 1100, the first standard cell 502 includes 2 pFETs and 1 nFET while the second standard cell 504 includes 1 pFET and 2 nFETs. Overall, the first and second standard cells in the IC structure 1100 collectively include 3 pFETs and 3 nFETs.

In various embodiments described above, standard cells are designed and placed according to the disclosed rules. Two or more standard cells are placed in cascade with adjacent cells being separated by a filler cell or by a dielectric gate. The filler cell spans from a dielectric gate to another dielectric gate. Each standard cell includes one or more gates. The gates and dielectric gates in the cascaded standard cells and the filler cells are distributed evenly with a pitch P. The multiple cascaded standard cells are formed on two continuous active regions, one being within an N well and another being within a P well. Each of the two continuous active regions extends through the cascaded standard cells and the filler cells interposed between.

Figure 13:
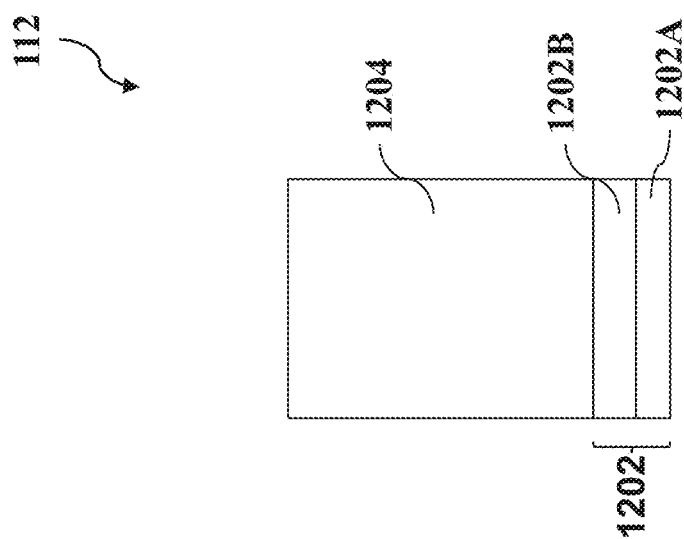
Figure 12:
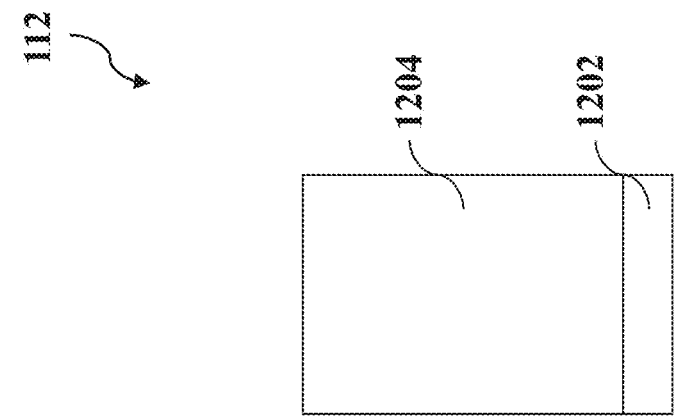

In various embodiments described above, the gates 112 are further described with reference to FIGS. 12-14 in sectional views, according to various embodiments. The gate 112 includes a gate dielectric layer 1202 (such as silicon oxide) and a gate electrode 1204 (such as doped polysilicon) disposed on the gate dielectric layer, as illustrated in FIG. 12.

In some embodiments, the gate 112 alternatively or additionally includes other proper materials for circuit performance and manufacturing integration. For example, the gate dielectric layer 1202 includes an interfacial layer 1202A (such as silicon oxide) and a high k dielectric material layer 1202B, as illustrated in FIG. 13. The high k dielectric material may include metal oxide, metal nitride or metal oxynitride. In various examples, the high k dielectric material layer includes metal oxide: $ZrO2$, $Al2O3$, and $HfO2$, formed by a suitable method, such as metal organic chemical vapor deposition (MOCVD), physical vapor deposition (PVD), atomic layer deposition (ALD), or molecular beam epitaxy (MBE). In some examples, the interfacial layer includes silicon oxide formed by ALD, thermal oxidation or ultraviolet-Ozone Oxidation. The gate electrode 1204 includes metal, such as aluminum, copper, tungsten, metal silicide, doped polysilicon, other proper conductive material or a combination thereof. The gate electrode may include multiple conductive films designed such as a capping layer, a work function metal layer, a blocking layer and a filling metal layer (such as aluminum or tungsten). The multiple conductive films are designed for work function matching to n-type FET (nFET) and p-type FET (pFET), respectively. In some embodiments, the gate electrode for nFET includes a work function metal with a composition designed with a work function equal 4.2 eV or less and the gate electrode for pFET includes a work function metal with a composition designed with a work function equal 5.2 eV or greater. For examples, the work function metal layer for nFET includes tantalum, titanium aluminum, titanium aluminum nitride or a combination thereof. In other examples, the work function metal layer for pFET includes titanium nitride, tantalum nitride or a combination thereof.

Figure 14:
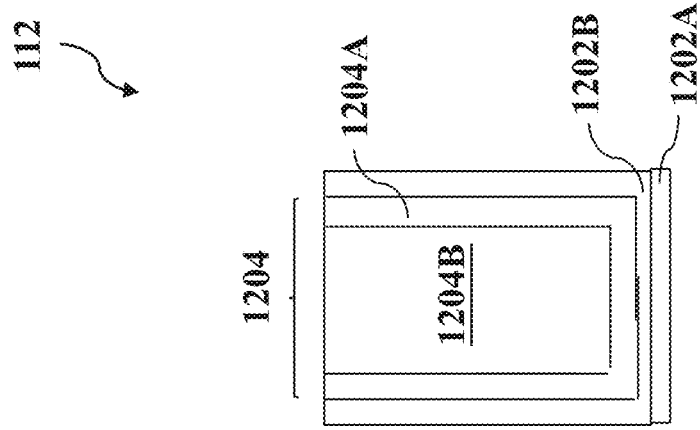
FIGS. 12, 13 and 14 are sectional views of a gate in an IC structure in accordance with some embodiments.

In some embodiments illustrated in FIG. 14, the gate 112 is formed by a different method with a different structure. The gate may be formed by various deposition techniques and a proper procedure, such as gate-last process, wherein a dummy gate is first formed, and then is replaced by a metal gate after the formation the source and drain features. Alternatively, the gate is formed by a high-k-last a process, wherein the both gate dielectric material layer and the gate electrode are replaced by high k dielectric material and metal, respectively, after the formation of the source and drain features. In a high-k-last process, a dummy gate is first formed by deposition and patterning; then source/drain features are formed on gate sides and an inter-layer dielectric layer is formed on the substrate; the dummy gate is removed by etching to result in a gate trench; and then the gate material layers are deposited in the gate trench. In the present example, the gate electrode 1204 includes a work function metal layer 1204A and a filling metal 1204B, such as aluminum or copper. Thus formed gate 112 has various gate material layers U-shaped.

The present disclosure provides various embodiments of an IC structure having multiple standard cells configured according to the predefined rules. In various embodiments described above, standard cells are designed and placed according to the disclosed rules. Two or more standard cells are placed in cascade with adjacent cells being separated by a filler cell or by a dielectric gate. The filler cell spans from a dielectric gate to another dielectric gate. Each standard cell includes one or more gates. The gates and dielectric gates in the cascaded standard cells and the filler cells are distributed evenly with a pitch P. The multiple cascaded standard cells are formed on two continuous active regions, one being within an N well and another being within a P well. Each of the two continuous active regions extends through the cascaded standard cells and the filler cells interposed between. Various advantages may present in various embodiments. By utilizing the disclosed layout having multiple standard cells, the IC structure, such as a logic circuit, has a high packing density and enhanced circuit performance. In some embodiments, the adjacent standard cells have a spacing of one pitch dimension P, which ensure logic circuit packing density. The active regions are continuous through multiple cells, and a transistor is isolated by a dielectric gate. The continuity of the active regions maintains a regular layout for fabrication friendliness. In some embodiments, since a transistor is always next to a dielectric gate, the design uncertainty is reduced. There is not abutment constrain during cell placement with continuous active region and isolation by dielectric gate. Furthermore, the uniform local density of the dielectric gates and the gates lead to better device performance and processing uniformity.

Thus, the present disclosure provides an IC structure in accordance with some embodiments. The IC structure includes a first standard cell having a first p-type field-effect transistor (pFET) and a first n-type field-effect transistor (nFET) integrated, and having a first dielectric gate on a first standard cell boundary. The integrated circuit further includes a second standard cell being adjacent to the first standard cell, having a second pFET and a second nFET integrated, and having a second dielectric gate on a second standard cell boundary. The integrated circuit also includes a first filler cell configured between the first and second standard cells, and having a one-pitch dimension P. The first pFET and the second pFET are formed on a first continuous active region. The first nFET and the second nFET are formed on a second continuous active region. The first filler cell includes a third dielectric gate on a first filler cell boundary and a fourth dielectric gate on a second filler cell boundary.

The present disclosure provides an IC structure in accordance with some other embodiments. The integrated circuit includes a first standard cell and a second standard cell. The first standard cell further includes a first gate stack, a second gate stack, a first dielectric gate on a first standard cell boundary, and a second dielectric gate contacting the second gate stack. The second standard cell further includes a third gate stack, a fourth gate stack, a third second dielectric gate on a second standard cell boundary, and a fourth dielectric gate contacting the fourth gate stack. The IC structure also includes a first filler cell disposed between the first and second standard cells, and spanning from a fifth dielectric gate and a sixth dielectric gate; a first continuous active region extending through the first standard cell, the first filler cell and the second standard cell along a first direction; and a second continuous active region extending through the first standard cell, the first filler cell and the second standard cell along the first direction. The first filler cell adjoins the first standard cell on the fifth dielectric gate and adjoins the second standard cell on the sixth dielectric gate. Each of the first gate stack, the third gate stack, the first dielectric gate, the third dielectric gate, the fifth dielectric gate, and the sixth dielectric gate is extending, along a second direction being orthogonal to the first direction, from the first continuous active region to the second continuous active region.

The present disclosure provides an IC structure in accordance with some other embodiments. The integrated circuit includes a first standard cell having a gate stack, and having a first dielectric gate on a first standard cell boundary; a second standard cell being adjacent to the first standard cell, having a second gate stack, and having a second dielectric gate on a second standard cell boundary; and a first filler cell configured between the first and second standard cells, and spanning from the first dielectric gate to the second dielectric gate with a first dimension $D_f$. Each of the first gate stack, the second gate stack, the first dielectric gate and the second dielectric gate is extended from a first continuous active region to a second continuous active region. A second dimension $D_1$ is measured from the first gate stack to the first dielectric gate. A third dimension $D_2$ is measured from the second gate stack to the second dielectric gate. The three dimensions are related as $D_f=D_1=D_2$.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. An integrated circuit, comprising:
   a first standard cell having a first gate stack, a second gate stack, a first dielectric gate on a first standard cell boundary, a second dielectric gate on a second standard cell boundary, and a third dielectric gate contacting the second gate stack;
   a second standard cell having a third gate stack, a fourth gate stack, a fourth dielectric gate on a third standard cell boundary, a fifth dielectric gate on a fourth standard cell boundary, and a sixth dielectric gate contacting the fourth gate stack;
   a filler cell disposed between the first and second standard cells, and spanning from the second dielectric gate to the fifth dielectric gate;
   a first active region continuously extending through the first standard cell, the filler cell and the second standard cell along a first direction; and
   a second active region continuously extending through the first standard cell, the filler cell and the second standard cell along the first direction, wherein
   gate stacks and dielectric gates are longitudinally oriented along a second direction perpendicular to the first direction,
   the third dielectric gate is disposed directly on the first active region and distanced away from the second active region, and
   the sixth dielectric gate is disposed directly on the second active region and distanced away from the first active region.

2. The integrated circuit of claim 1, wherein the filler cell further includes a seventh dielectric gate equally distanced from the second and fifth dielectric gates.

3. The integrated circuit of claim 1, wherein the gate stacks and the dielectric gates are evenly distributed with a periodic pitch P.

4. The integrated circuit of claim 3, wherein
the filler cell spans a two-pitch dimension 2*P from the second dielectric gate and the fifth dielectric gate along the first direction;
the first standard cell spans a first dimension $D_1$ from the first dielectric gate to the second dielectric gate along the first direction; and
the second standard cell spans a second dimension $D_2$ from the fourth dielectric gate to the fifth dielectric gate along the first direction, wherein each of $D_2$ and $D_1$ is greater than 2P.

5. The integrated circuit of claim 4, wherein $D_2=D_1=3*P$.

6. The integrated circuit of claim 1, wherein each of the first and third gate stacks and each of the first, second, fourth, fifth and seventh dielectric gates are extending from the first active region to the second active region.

7. The integrated circuit of claim 1, wherein
the third dielectric gate is aligned with the second gate stack along the second direction; and
the sixth dielectric gate is aligned with the fourth gate stack along the second direction.

8. An integrated circuit, comprising:
a first standard cell having a first gate stack, a second gate stack, a first dielectric gate on a first standard cell boundary, and a second dielectric gate contacting the second gate stack;
a second standard cell having a third gate stack, a fourth gate stack, a third dielectric gate on a second standard cell boundary, and a fourth dielectric gate contacting the fourth gate stack; and
a first and second active regions continuously extending through the first standard cell and the second standard cell along a first direction and being distanced from each other along a second direction perpendicular to the first direction, wherein
the first standard cell adjoins the second standard cell on a fifth dielectric gate,
each of the first gate stack, the third gate stack, the first dielectric gate, the first dielectric gate, the third dielectric gate, and the fifth dielectric gate is longitudinally orienting along the second direction and is extending from the first active region to the second active region,
the second gate stack and the second dielectric gate are aligned along the second direction, and
the fourth dielectric gate and the fourth gate stack are aligned along the second direction.

9. The integrated circuit of claim 8, wherein
the second gate stack and the fourth dielectric gate are formed directly on the first active region and are distanced away from the second active region; and
the second dielectric gate and the fourth gate stack are formed directly on the second active region and are distanced away from the first active region.

10. The integrated circuit of claim 8, wherein
the second gate stack and the fourth gate stack are formed directly on the first active region and are distanced away from the second active region; and
the second dielectric gate and the fourth dielectric gate are formed directly on the second continuous active region and are distanced away from the second active region.

11. The integrated circuit of claim 10, wherein
the first active region is enclosed in an n-type doped well; and
the second active region is enclosed in a p-type doped well.

12. The integrated circuit of claim 10, wherein
the first active region is enclosed in a p-type doped well; and
the second active region is enclosed in an n-type doped well.

13. The integrated circuit of claim 8, wherein each of the first, second, third, and fourth gate stacks includes a gate dielectric layer and a gate electrode over the gate dielectric layer.

14. The integrated circuit of claim 8, wherein
the first gate stack is interposed between the second gate stack and the first dielectric gate; and
the third gate stack is interposed between the fourth gate stack and the third dielectric gate.

15. The integrated circuit of claim 8, wherein
the first standard cell spans a first dimension $D_1$ along the first direction; and
the second standard cell spans a second dimension $D_2$ along the first direction, wherein $D_2=D_1$.

16. An integrated circuit, comprising:
a first standard cell having a first gate stack, a second gate stack, a first dielectric gate on a first standard cell boundary, and a second dielectric gate contacting the second gate stack;
a second standard cell having a third gate stack, a fourth gate stack, a third dielectric gate on a second standard cell boundary, and a fourth dielectric gate contacting the fourth gate stack; and
a filler cell disposed between the first and second standard cells, and spanning a one-pitch dimension P from a fifth dielectric gate and a sixth dielectric gate along a first direction, wherein
the first standard cell spans a first dimension $D_1$ from the first dielectric gate to the fifth dielectric gate along the first direction,
the second standard cell spans a second dimension $D_2$ from the third dielectric gate to the sixth dielectric gate along the first direction, and $D_2=D_1>P$.

17. The integrated circuit of claim 16, further comprising
a first active region extending through the first standard cell and the second standard cell; and
a second active region extending through the first standard cell and the second standard cell, wherein
the first active region is enclosed in a first doped well of a first doping type; and
the second active region is enclosed in a second doped well of a second doping type being opposite the first doping type.

18. The integrated circuit of claim 17, wherein
each of the first gate stack, the third gate stack, the first dielectric gate, and the third dielectric gate is extending from the first active region to the second active region along a second direction being orthogonal to the first direction; and
$D_2=D_1 \geq 3*P$.

19. The integrated circuit of claim 17, wherein
the second gate stack and the fourth dielectric gate are formed directly on the first active region and are distanced away from the second active region; and
the second dielectric gate and the fourth gate stack are formed directly on the second active region and are distanced away from the first active region.

20. The integrated circuit of claim 17, wherein
the second gate stack and the fourth gate stack are formed directly on the first active region;
the second dielectric gate and the fourth dielectric gate are formed directly on the second active region;
the second gate stack and the second dielectric gate are aligned along the second direction; and
the fourth gate stack and the fourth dielectric gate are aligned along the second direction.

\* \* \* \* \*